(12) United States Patent
Leirer et al.

(10) Patent No.: US 12,068,281 B2
(45) Date of Patent: Aug. 20, 2024

(54) SURFACE MOUNTABLE OPTOELECTRONIC SEMICONDUCTOR DEVICE AND METHOD FOR MANUFACTURING A SURFACE MOUNTABLE OPTOELECTRONIC SEMICONDUCTOR DEVICES

(71) Applicant: OSRAM OLED GMBH, Regensburg (DE)

(72) Inventors: Christian Leirer, Friedberg (DE); Michael Schumann, Neu-Ulm (DE)

(73) Assignee: OSRAM OLED GMBH, Regensburg (DE)

( * ) Notice: Subject to any disclaimer, the term of this patent is extended or adjusted under 35 U.S.C. 154(b) by 740 days.

(21) Appl. No.: 17/261,505

(22) PCT Filed: Aug. 7, 2019

(86) PCT No.: PCT/EP2019/071263
§ 371 (c)(1),
(2) Date: Jan. 19, 2021

(87) PCT Pub. No.: WO2020/030714
PCT Pub. Date: Feb. 13, 2020

(65) Prior Publication Data
US 2021/0265317 A1  Aug. 26, 2021

(30) Foreign Application Priority Data
Aug. 10, 2018  (DE) .................... 10 2018 119 538.9

(51) Int. Cl.
*H01L 25/065* (2023.01)
*H01L 25/16* (2023.01)
(Continued)

(52) U.S. Cl.
CPC ........ *H01L 25/0657* (2013.01); *H01L 25/167* (2013.01); *H01L 33/005* (2013.01);
(Continued)

(58) Field of Classification Search
CPC . H01L 25/0657; H01L 25/167; H01L 33/005; H01L 33/44; H01L 33/62; H01L 2933/0066
See application file for complete search history.

(56) References Cited

U.S. PATENT DOCUMENTS

| | | | |
|---|---|---|---|
| 9,954,150 B2 | 4/2018 | Schwarz et al. | |
| 2005/0121796 A1* | 6/2005 | Park | H01L 23/4985 257/773 |

(Continued)

FOREIGN PATENT DOCUMENTS

| | | |
|---|---|---|
| DE | 102012112302 A1 | 6/2014 |
| DE | 102016121099 A1 | 5/2018 |
| WO | 2013021519 A1 | 2/2013 |

*Primary Examiner* — Lex H Malsawma
*Assistant Examiner* — Sean Ayers Winters
(74) *Attorney, Agent, or Firm* — ARENTFOX SCHIFF LLP

(57) ABSTRACT

In an embodiment, the semiconductor device is surface mountable and comprises a light emitting semiconductor chip which comprises electrical contact pads. An opaque base body laterally surrounds the semiconductor chip. An electrical fanning layer contains electrical conductor tracks. Electrical connection pads are used for external electrical contacting of the semiconductor device. The contact pads and the connection pads are located on different sides of the fanning layer. The contact pads are electrically connected to the associated connection pads by means of the fanning layer. The connection pads are expanded relative to the contact pads.

20 Claims, 38 Drawing Sheets

Figure 1:
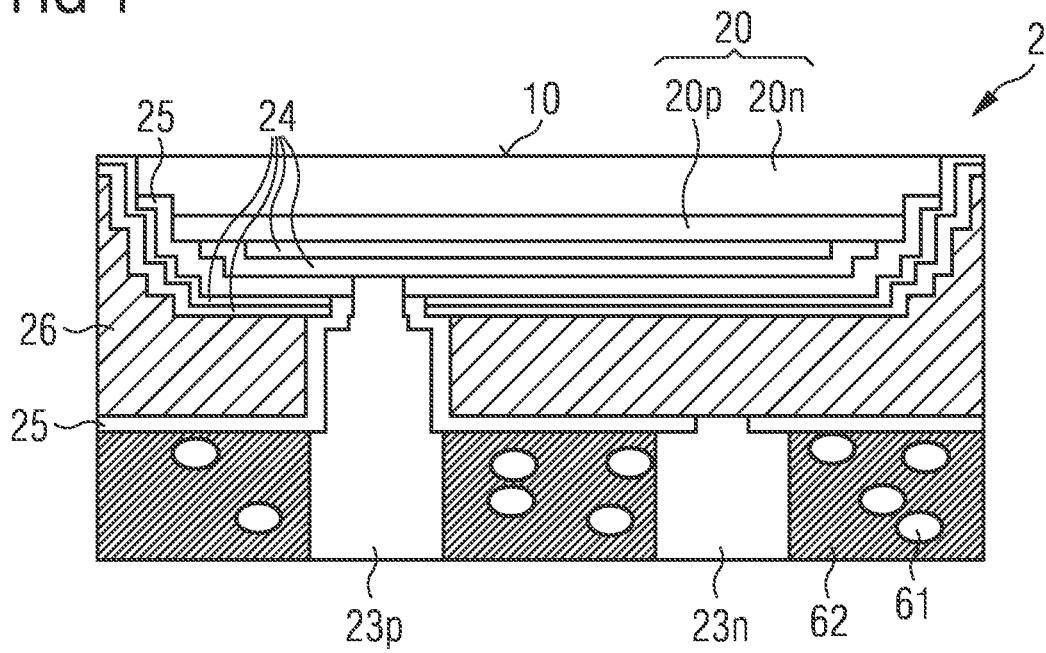

(51) Int. Cl.
  *H01L 33/00* (2010.01)
  *H01L 33/44* (2010.01)
  *H01L 33/62* (2010.01)
(52) U.S. Cl.
  CPC .............. *H01L 33/44* (2013.01); *H01L 33/62* (2013.01); *H01L 2933/0066* (2013.01)

(56) References Cited

U.S. PATENT DOCUMENTS

| | | | |
|---|---|---|---|
| 2006/0102992 A1* | 5/2006 | Kwon | H01L 24/85 |
| | | | 257/E23.114 |
| 2008/0308917 A1 | 12/2008 | Pressel et al. | |
| 2009/0224391 A1* | 9/2009 | Lin | H01L 24/18 |
| | | | 438/106 |
| 2010/0193819 A1 | 8/2010 | Sorg et al. | |
| 2012/0056217 A1 | 3/2012 | Jung et al. | |
| 2015/0014862 A1* | 1/2015 | Kwon | H01L 23/3128 |
| | | | 257/775 |
| 2015/0064818 A1* | 3/2015 | Li | H10K 71/13 |
| | | | 438/46 |
| 2015/0098191 A1* | 4/2015 | Kim | H01L 23/3672 |
| | | | 361/705 |
| 2015/0325598 A1 | 11/2015 | Pfeuffer et al. | |
| 2016/0172558 A1* | 6/2016 | Liu | H01L 33/40 |
| | | | 257/98 |
| 2016/0300815 A1* | 10/2016 | Kim | H01L 24/94 |
| 2017/0141066 A1 | 5/2017 | Toyota | |
| 2017/0148955 A1 | 5/2017 | Wu | |
| 2017/0316736 A1* | 11/2017 | Hughes | H01L 25/0753 |
| 2018/0069163 A1 | 3/2018 | Clark et al. | |
| 2018/0090650 A1 | 3/2018 | Takeda et al. | |
| 2018/0246363 A1* | 8/2018 | Nemati | G02F 1/133514 |
| 2019/0273191 A1 | 9/2019 | Tangring et al. | |

* cited by examiner

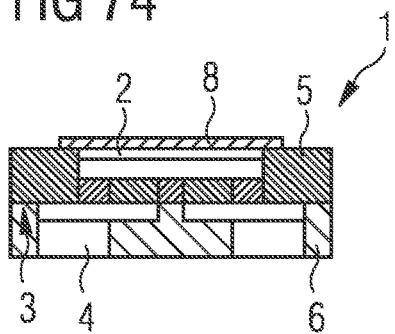
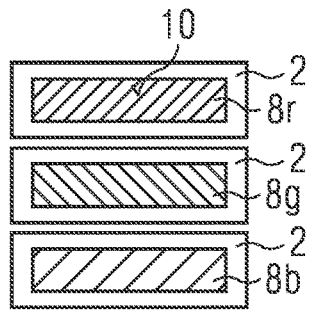
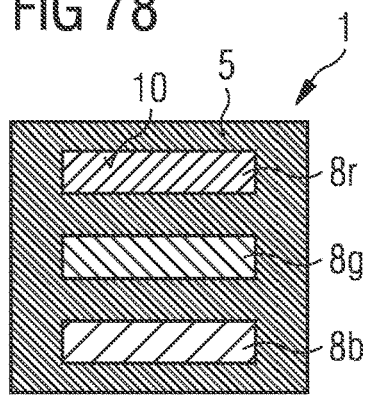
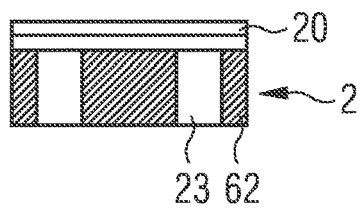
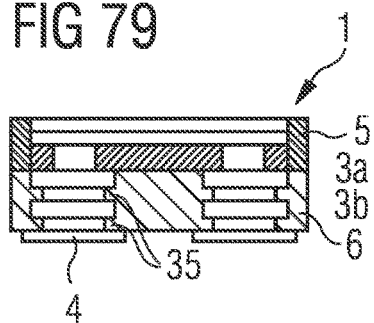
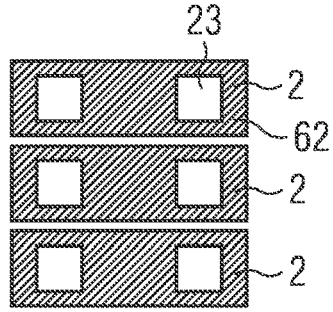
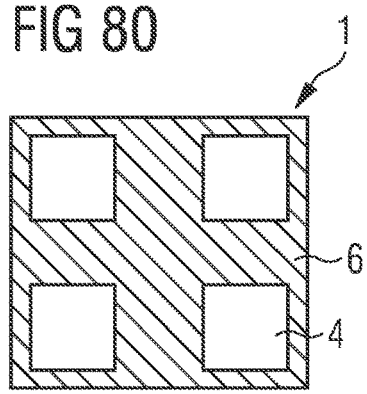

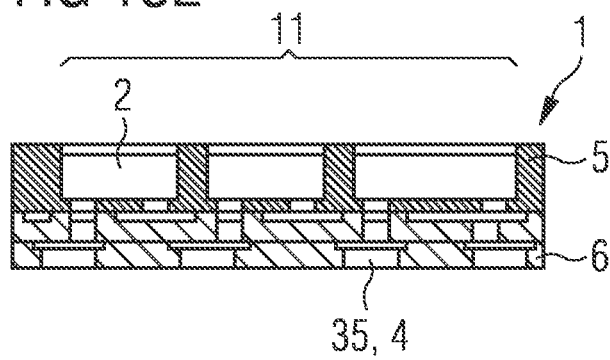
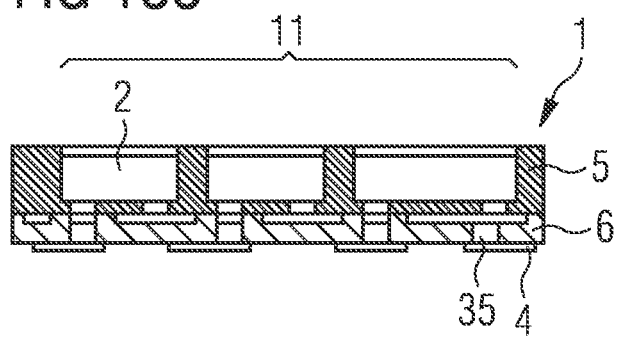
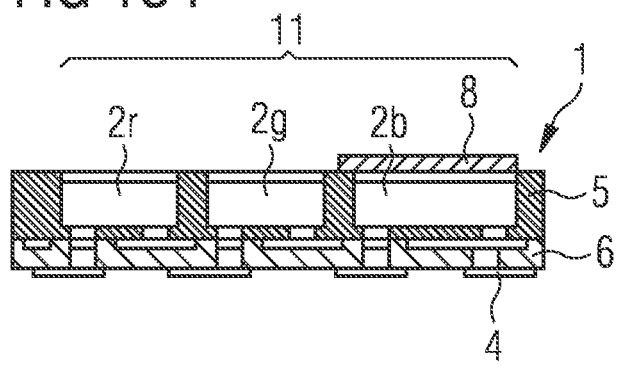

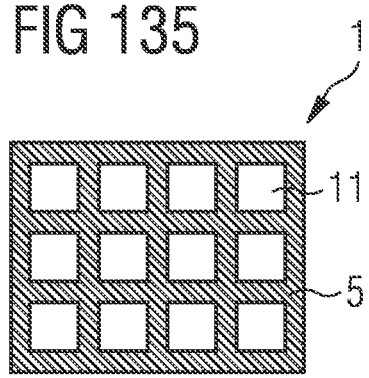
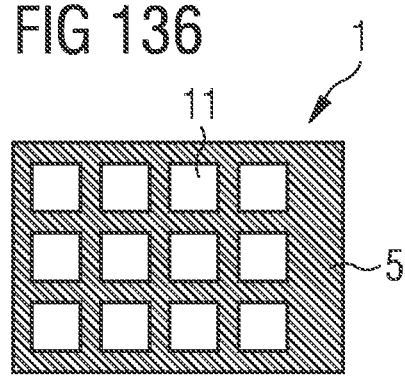
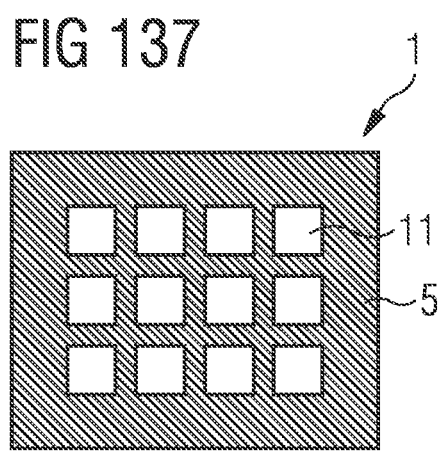
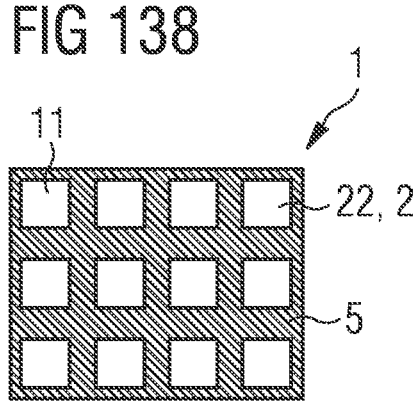
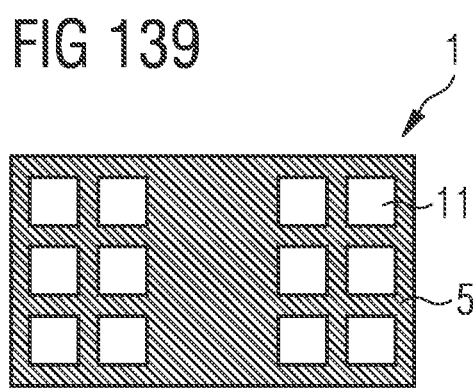
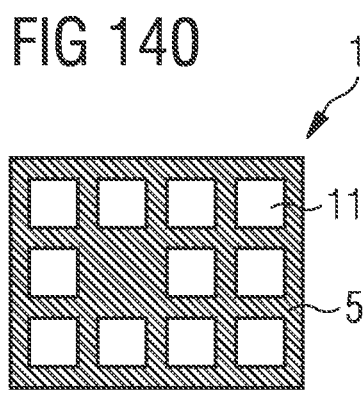

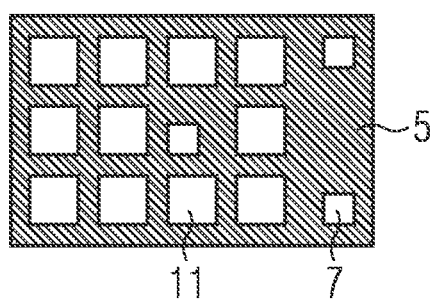
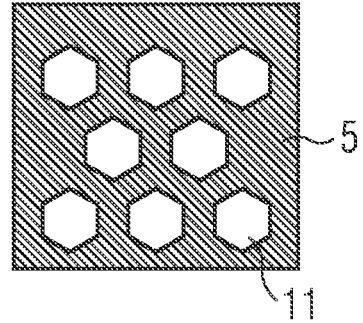
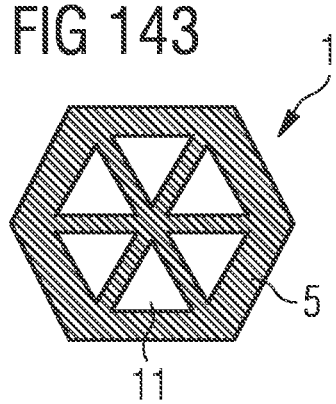

SURFACE MOUNTABLE OPTOELECTRONIC SEMICONDUCTOR DEVICE AND METHOD FOR MANUFACTURING A SURFACE MOUNTABLE OPTOELECTRONIC SEMICONDUCTOR DEVICES

This application is a 35 U.S.C. § 371 National Phase of PCT Application No. PCT/EP2019/071263, filed Aug. 7, 2019, which claims priority to German Application No. 10 2018 119 538.9, filed Aug. 10, 2018, the disclosures of which are hereby incorporated by reference herein in their entireties.

An optoelectronic semiconductor device is specified. In addition, a method for manufacturing such a semiconductor device is specified.

Publication US 2010/0193819 A1 relates to LED chips mounted on a carrier with electrical connection pads.

An IC device with a fan-out structure is known from the printed publication US 2008/0308917 A1.

In the publication US 2017/0141066 A1, electronic components with multiple layers of electrical conductor tracks in a carrier are found.

Publication DE 10 2016 121 099 A1 discloses a manufacturing method for LED components in which LED chips are encapsulated and subsequently singulated through a potting.

An object to be solved is to specify an optoelectronic semiconductor device that can be efficiently manufactured and assembled.

This object is solved, inter alia, by an optoelectronic semiconductor device and by a method for manufacturing having the features of the independent patent claims. Preferred further developments are the subject of the dependent claims.

In the semiconductor device described herein, at least one light-emitting semiconductor chip having electrical contact pads is provided on a fanning layer, also referred to as a fan-out. The fanning layer connects the contact pads of the semiconductor chip to electrical connection pads of the semiconductor device. As a result, the connection pads may be made larger or comprise a greater distance from each other than the contact pads.

According to at least one embodiment, the semiconductor device is surface-mountable. That is, the semiconductor device can be mounted to an external carrier such as a printed circuit board by means of surface mount technology, or SMT for short.

According to at least one embodiment, the semiconductor device comprises one or more light-emitting and/or infrared-emitting and/or ultraviolet-emitting semiconductor chips. The term "light-emitting" thus preferably refers here and hereinafter to visible light, but may equally include near-ultraviolet radiation and/or near-infrared radiation. The at least one semiconductor chip is a laser diode, a superluminescent diode, or preferably a light emitting diode chip, or LED chip for short.

According to at least one embodiment, the at least one semiconductor chip comprises electrical contact pads. The electrical contact pads may be located on two opposite main sides of the semiconductor chip. Preferably, the electrical contact pads are located on a single main side of the semiconductor chip. That is, the semiconductor chip may be a flip chip. It is possible that flip chips and chips with contact pads on both main sides are combined in the semiconductor device. Preferably, however, all semiconductor chips are flip chips.

According to at least one embodiment, the semiconductor device comprises an opaque base body. In particular, the base body is non-transmissive to radiation generated during operation of the semiconductor chips.

According to at least one embodiment, the base body laterally surrounds the at least one semiconductor chip. That is, side surfaces of the semiconductor chip may be completely and/or circumferentially directly covered by the base body. At least one light exit side of the semiconductor chip is preferably free of the base body. One side of the semiconductor chip where the contact pads are located may be completely covered by the contact pads together with the base body.

The base body is preferably reflective to visible light and appears white to an observer, for example. Likewise, the base body may be absorbent and thus black, or it may have a colored design.

According to at least one embodiment, the semiconductor device comprises one or more electrical fanning layers. The at least one fanning layer comprises a two-dimensionally structured electrically conductive layer. In the following, this structure is abbreviated to "conductor track". Preferably, this structure comprises one or more metals.

According to at least one embodiment, the semiconductor device comprises electrical connection pads for external electrical contacting of the semiconductor device. Preferably, the connection pads are suitable for surface mounting. The connection pads are preferably formed by one or more metal layers and are fully metallic.

According to at least one embodiment, the contact pads and the connection pads are located on different sides of the fanning layer. That is, the fanning layer may be located between the contact pads of the semiconductor chips and the connection pads of the semiconductor device. Thus, the at least one fanning layer may be an intermediate layer.

According to at least one embodiment, the contact pads are electrically connected to the associated connection pads by means of the fanning layer. There is preferably exclusively an ohmic, metallic and/or direct electrical connection between the contact pads and the connection pads via the fanning layer. Alternatively, further electrical components may be interposed, in particular if the semiconductor device comprises several layers of semiconductor chips or other additional components.

According to at least one embodiment, the connection pads are expanded relative to the contact pads. This means, for example, that the connection pads are enlarged relative to the associated contact pads and/or comprise a greater distance from one another and/or comprise a different base surface than the associated contact pads. In particular, the connection pads are at a different, larger pitch than the contact pads.

According to at least one embodiment, the base body extends between the semiconductor chip and the fanning layer. In other words, viewed in the vertical direction, i.e. perpendicular to the light exit side, the base body is located in places between the semiconductor chip and the fanning layer. For example, the semiconductor chip covers a portion of the base body in a plan view of the semiconductor device.

According to at least one embodiment, the optoelectronic semiconductor device comprises a chip potting. For example, contact pads of the semiconductor chip are embedded in the chip potting. The contact pads may terminate flush with the chip potting, in particular on a side of the chip potting opposite the light exit side. In particular, the chip potting completely fills a space between the contact pads. For example, the chip potting is opaque to radiation to be generated during operation. For example, the chip potting includes a polymeric material, such as an epoxy or a silicone.

In at least one embodiment, the semiconductor device is surface-mountable and comprises at least one during operation light emitting and/or infrared emitting and/or ultraviolet emitting semiconductor chip comprising electrical contact pads. An opaque base body or an opaque base body with respect to the emitted radiation laterally surrounds the at least one semiconductor chip. An electrical fanning layer includes electrical conductor tracks. Electrical connection pads serve for external electrical contacting of the semiconductor device. The contact pads and the connection pads are located on different sides of the fanning layer. The contact pads are electrically connected to the corresponding connection pads by means of the fanning layer. The connection pads are geometrically expanded relative to the contact pads.

According to at least one embodiment, the conductor tracks of the fanning layer and the connection pads are embedded in at least one embedding body, in particular in exactly one embedding body. In this case, the embedding body can comprise several partial layers, preferably each made of the same material. The embedding body is preferably produced by means of casting, injection molding and/or pressing, but can also be a laminated film.

According to at least one embodiment, the embedding body directly adjoins the base body. That is, the embedding body and the base body are in contact. In the direction towards the embedding body, the base body is preferably flush with the contact pads and with the conductor tracks of the fanning layer closest to the respective light-emitting semiconductor chip.

According to at least one embodiment, a semiconductor layer sequence of the semiconductor chip is located on a side of the contact pads facing away from the fanning layer. A current spreading structure located within the semiconductor chip may be arranged between the semiconductor layer sequence and the contact pads, in particular if the semiconductor chip is a flip chip. A main side of the semiconductor chips facing away from the fanning layer is preferably free of electrical contact pads.

According to at least one embodiment, the semiconductor chip or at least one of the semiconductor chips is divided into a plurality of pixels. The pixels are preferably electrically controllable independently of each other. A number of contact pads of the respective semiconductor chip is preferably twice the number of pixels or the number of pixels plus 1.

According to at least one embodiment, the semiconductor device comprises a plurality of the light-emitting and/or infrared-emitting and/or ultraviolet-emitting semiconductor chips. The semiconductor chips are embedded together in the main body. Preferably, these semiconductor chips lie in a common plane. This common plane may be oriented parallel to the fanning layer or to at least one of the fanning layers.

According to at least one embodiment, the semiconductor device comprises fewer connection pads in total than there are contact pads. Thus, a number of connection pads may be reduced compared to a single assembly of the semiconductor chips. The reduction of the connection pads is made possible in particular by a course of the conductor tracks in the at least one fanning layer. Thus, in the fanning layer or in the fanning layers, several of the contact pads of the semiconductor chips can be directly electrically connected to each other.

According to at least one embodiment, the semiconductor device comprises a plurality of the fanning layers. The conductor tracks in the different fanning layers preferably extend at least partially differently from each other. That is, the conductor tracks in the fanning layers are arranged to be only partially coincident.

According to at least one embodiment, at least one partial layer of the embedding body is present per fanning layer. Preferably, a number of partial layers of the embedding body is equal to the number of fanning layers.

According to at least one embodiment, adjacent fanning layers are electrically connected to each other via electrical vias.

The vias may be of the same or of a different material than the conductor tracks of the fanning layers. The vias preferably run perpendicular to the fanning layers. In particular, the vias comprise smaller lateral dimensions than the associated conductor tracks of the adjacent fanning layer or of the two adjacent fanning layers. It is possible that the vias comprise a greater height than the fanning layers are thick.

According to at least one embodiment, at least one or the plurality of the fanning layers or each of the fanning layers or the respective fanning layer together with the associated vias comprises a thickness that is at most 30 µm or 20 µm or 10 µm. Alternatively or additionally, this thickness is at most 75% or 50% or 30% of an average thickness of the at least one associated semiconductor chip. In other words, the fanning layers together with the vias are comparatively thin. The fanning layers preferably do not contribute significantly to an overall thickness of the semiconductor device.

According to at least one embodiment, the semiconductor device comprises one or more additional chips. The at least one additional chip is preferably selected from the following group: photodiode, phototransistor, IC chip, IC chip with integrated photodiode, resistor, temperature-dependent resistor, protective diode against damage caused by electrostatic discharges, ESD diode for short, memory chip, address chip, placeholder chip, also referred to as via chip or dummy chip. Several different types of additional chips may be present in the semiconductor device in combination with each other.

According to at least one embodiment, the additional chip or one of the additional chips is arranged laterally adjacent to the at least one semiconductor chip. Thus, the semiconductor chip and the respective additional chip may be disposed in a common plane parallel to the fanning layer and/or the connection pads. It is possible that the semiconductor chips are located in a plane on a light exit side, and that some or all of the additional chips are arranged in an underlying plane or in multiple underlying planes.

According to at least one embodiment, the semiconductor device comprises one or more planar electrical interconnect lines. The at least one interconnect line is located only on a side of the semiconductor chip or the additional chip facing away from the fanning layer. The interconnect line is applied to the base body in places. Via the connection lines, for example, electrical contact pads of the additional chips and/or of the semiconductor chips, provided that these are not flip chips, can be electrically connected, these contact pads being located on the light exit side.

According to at least one embodiment, the interconnect line or at least one of the interconnect lines or all of the interconnect lines is electrically connected directly to the fanning layer or one of the fanning layers. This means that the interconnect line is in ohmic contact with the fanning layer. Alternatively or additionally, an electrical component such as one of the additional chips may be provided between at least one of the interconnect lines and the associated fanning layer.

According to at least one embodiment, the connection pads and the embedding body are flush with each other in the direction away from the semiconductor chip. Alternatively, the connection pads may overhang the embedding body in the direction away from the at least one semiconductor chip.

According to at least one embodiment, the base body, the fanning layer and/or the embedding body terminate flush with each other in the lateral direction. That is, lateral dimensions of the semiconductor device are defined by the base body together with the fanning layer and the embedding body. In particular, none of the semiconductor chips and/or the additional chips extend to side surfaces of the semiconductor device.

According to at least one embodiment, the semiconductor device comprises one or more optical coatings. The at least one optical coating is selected from the group consisting of: phosphor layer, organic protective layer, filler layer, inorganic protective layer, resist layer, color filter layer such as daylight filter, diffuser layer, coloring layer, absorber layer, passivation layer, anti-reflective layer, mirror layer, dichroic layer. A plurality of differently configured coatings may be present in combination in the semiconductor device. For example, the coating comprises a material, in particular as a matrix material for an admixture, the material being a silicone, an epoxy, a glass and/or a polysiloxane or a polysilazane.

According to at least one embodiment, the coating or one of the coatings partially or completely covers the semiconductor chip or at least one of the semiconductor chips. In particular, such coating is a phosphor layer and/or a diffuser layer.

According to at least one embodiment, viewed in plan view, a base surface of the semiconductor device is larger than a base surface of the at least one semiconductor chip by at most a factor of 5 or 3 or 1.5. In other words, due to the base body and the embedding body and the fanning layer, the semiconductor device is not too much enlarged compared to the semiconductor chips.

According to at least one embodiment, the at least one semiconductor chip and/or the coating terminates flush with the base body in the direction away from the connection pads. This is in particular true if the coating is a phosphor layer.

According to at least one embodiment, the semiconductor device is provided for a video wall. Compared to an arrangement of individual semiconductor chips or pixels on a mounting substrate, many of the pixels can be integrated in the semiconductor device described here, so that the video wall can be assembled from relatively few or even only one semiconductor device. Thus, an assembly effort can be reduced. For example, the video wall comprises 1920×1080 pixels.

According to at least one embodiment, the semiconductor device comprises one or more pixels. The at least one pixel is configured to emit light of an adjustable color. Thus, the pixels can be used for displaying motion pictures.

According to at least one embodiment, each of the pixels comprises a plurality of the semiconductor chips. The semiconductor chips within the pixels may be of identical construction and may be provided with at least one phosphor for emitting different colors. Alternatively, the semiconductor chips are constructed differently from each other and preferably emit red, green and blue light.

According to at least one embodiment, a distance between adjacent semiconductor chips within the pixels is equal to a distance between adjacent pixels. Thus, it is possible that the same semiconductor chip can be assigned to different pixels in time succession. That is, the pixels can overlap when viewed in plan view and share semiconductor chips.

According to at least one embodiment, an outer edge of the base body is narrower than a distance between adjacent pixels when viewed from the light exit side in plan view. Thus, a plurality of the semiconductor devices can be arranged adjacent to each other so that across the device, the pixels can be arranged in a uniform grid, for example, in a rectangular grid or in a hexagonal grid.

In addition, a method for manufacturing is specified. The method for manufacturing is used to manufacture an optoelectronic semiconductor device as specified in connection with one or more of the above embodiments. Features of the method for manufacturing are therefore also disclosed for the semiconductor device, and vice versa.

In at least one embodiment, the method for manufacturing comprises the following steps, preferably in the order indicated:
A) providing the semiconductor chips,
B) embedding the semiconductor chips in the base body,
D) creating the fanning layer,
E) applying the connection pads to the finished fanning layer,
F) creating the opaque embedding body by casting, spraying, pressing, and/or film lamination, and
G) singulating into the semiconductor devices.

According to at least one embodiment, the method for manufacturing comprises the following steps, preferably in the order indicated:
A) providing the semiconductor chips,
B) embedding the semiconductor chips in the base body,
D) creating the fanning layer,
E2) applying the vias to the finished fanning layer,
F) creating the opaque embedding body by casting, spraying and/or or pressing,
X) repeating steps D), E2), and F) to create additional layers of fanning layers,
D) creating the fanning layer,
E) applying the connection pads to the finished fanning layer,
F) creating the opaque embedding body by casting, spraying, pressing, and/or film lamination, and
G) singulating into the semiconductor devices.

According to at least one embodiment, in addition to semiconductor chips, auxiliary chips may also be provided in step A).

According to at least one embodiment, at least steps A) to F) and optionally step G) are performed on an auxiliary carrier. The auxiliary carrier is only temporarily present. Thus, the auxiliary carrier is not a component of the finished semiconductor devices.

According to at least one embodiment, planarization or thinning is performed between steps B) and D) in a step C). By means of a planarization it can be achieved that semiconductor chips with different thicknesses are made equally thick. In this step, in particular, a reduction in the thickness of the semiconductor chips and/or the optionally present additional chips takes place.

According to at least one embodiment, one or more cleaning steps can take place after each of the listed process steps. This may be, for example, a mechanical cleaning, a chemical cleaning, an electrical cleaning or a combination thereof.

According to at least one embodiment, at least one main surface of the semiconductor chips each remains free of the base body in step B). The side surfaces of the semiconductor chips, on the other hand, are covered directly and predominantly or over the entire surface by the base body. Predominantly means here and in the following in particular at least 60% or 80% or 90%.

According to at least one embodiment, steps F) and E) or F) and E2) are interchanged, so that the embedding body is created first and only then are created the connection pads and/or the vias. One option is to create the embedding body lithographically structured so that the connection pads and/or the vias remain free, and then to fill them with metal. Another option is to apply the embedding body in a closed manner, to use for example a laser drilling process to remove the material of the embedding body at the connection pads and/or at the vias, and to fill these with metal afterwards.

According to at least one embodiment, a step for creating the connection lines is inserted after step A) and before step G).

According to at least one embodiment, further semiconductor chips and/or additional chips are inserted between steps D) and E) or E2).

According to at least one embodiment, a further step for applying contact balls is performed between steps F) and G).

In the following, an optoelectronic semiconductor device described herein and a method for manufacturing described herein are explained in more detail with reference to the drawing by means of exemplary embodiments. Same reference signs thereby specify same elements in the individual Figures. However, no references to scale are shown, rather individual elements may be shown exaggeratedly large for better understanding.

Figure 6:
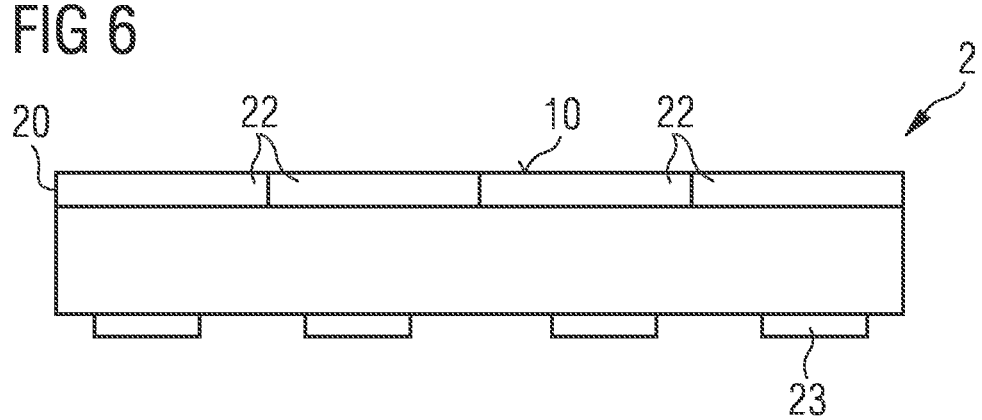
Figure 7:
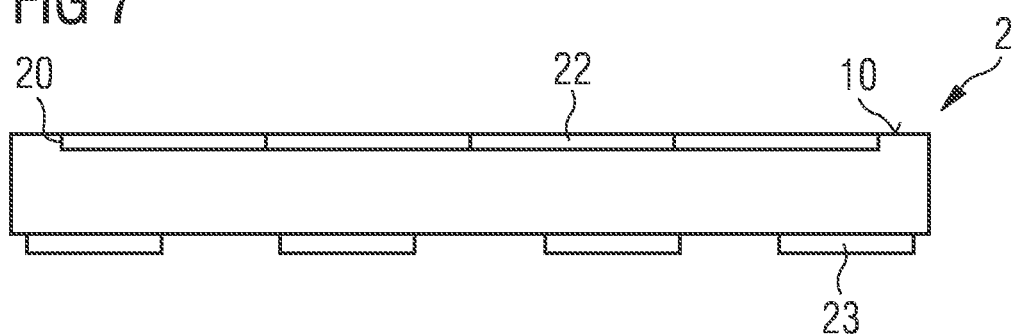
Figure 8:
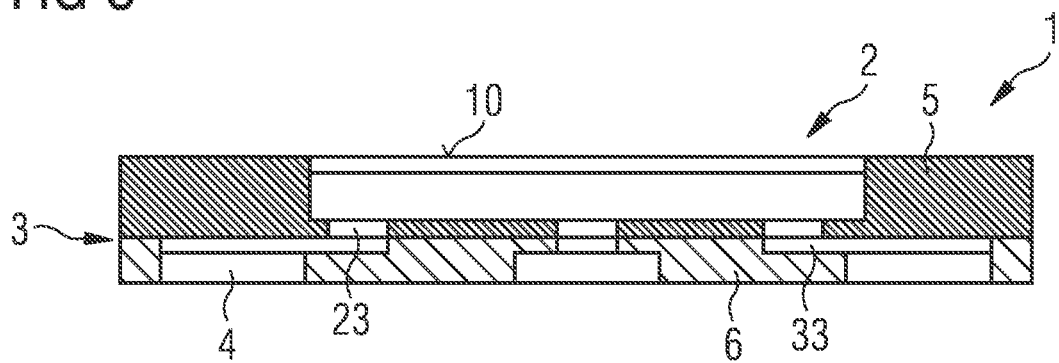
Figure 9:
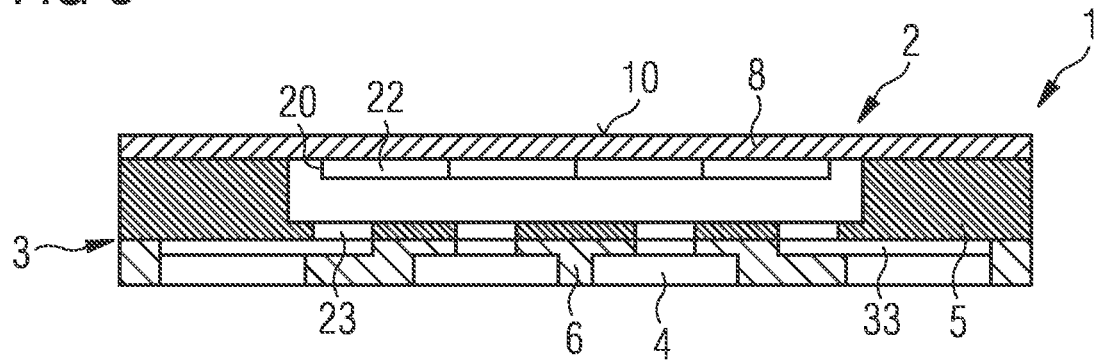
Figure 10:
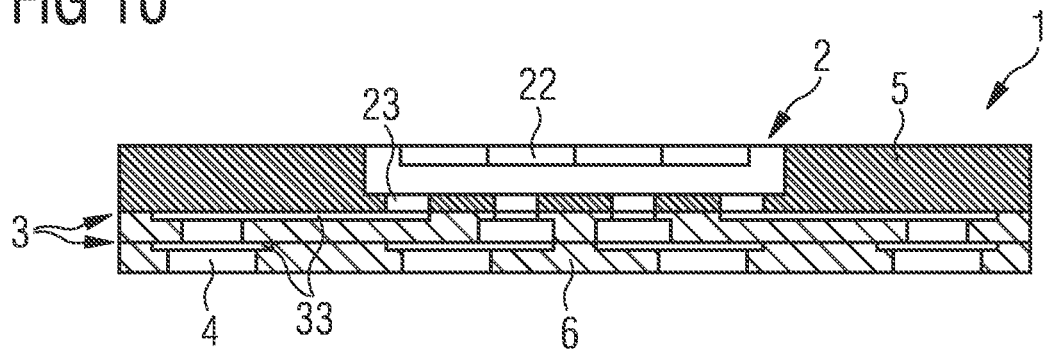
Figure 11:
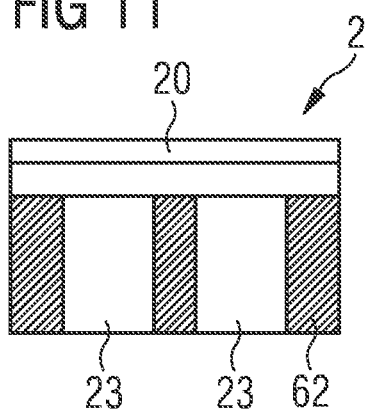
Figure 33:
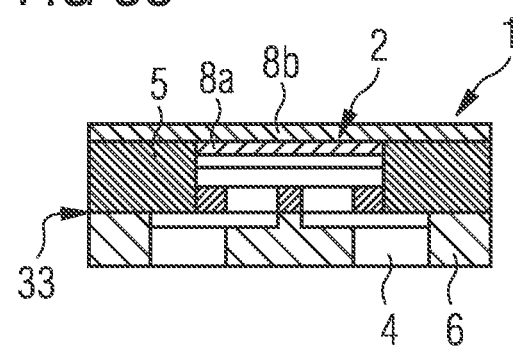
Figure 34:
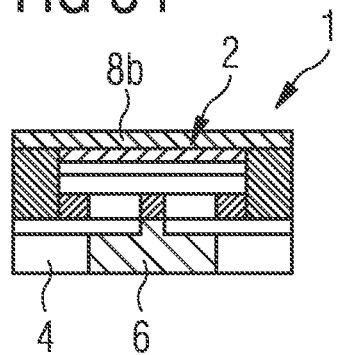
Figure 35:
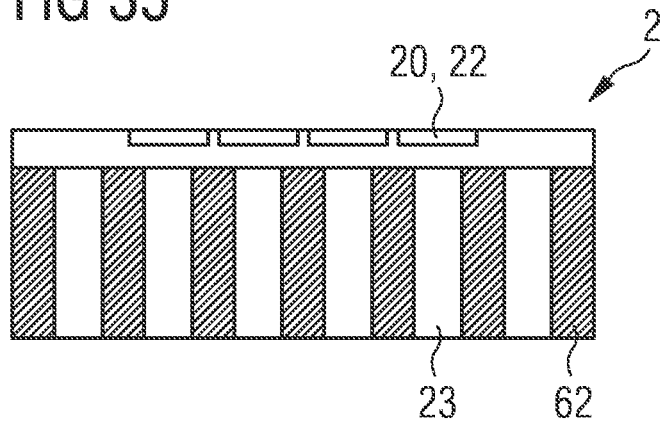
Figure 36:
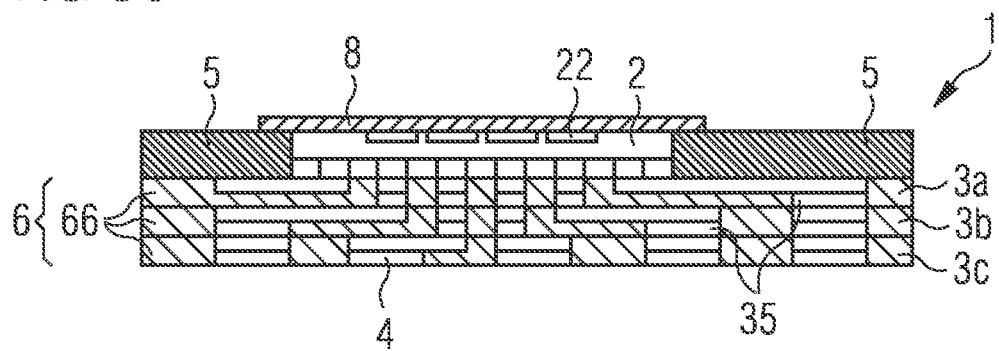
Figure 57:
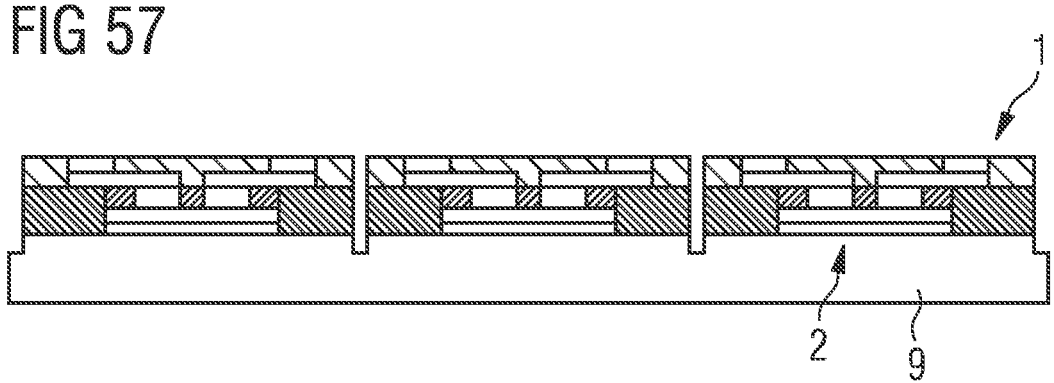
Figure 58:
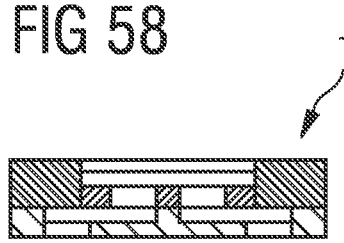
Figure 59:
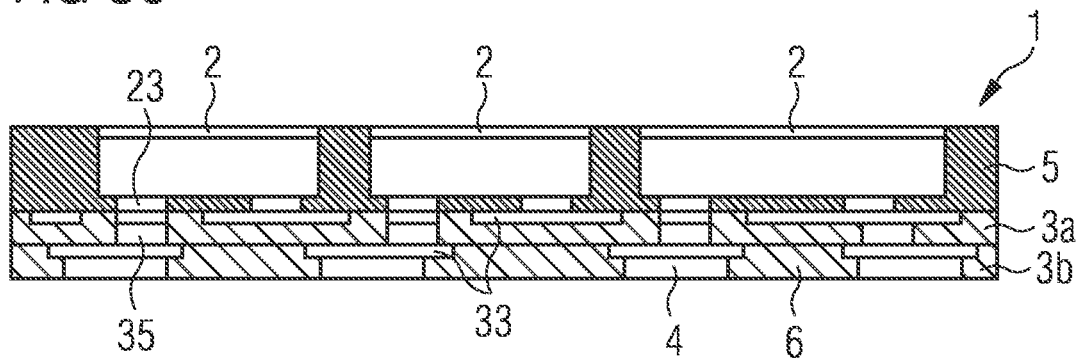
Figure 60:
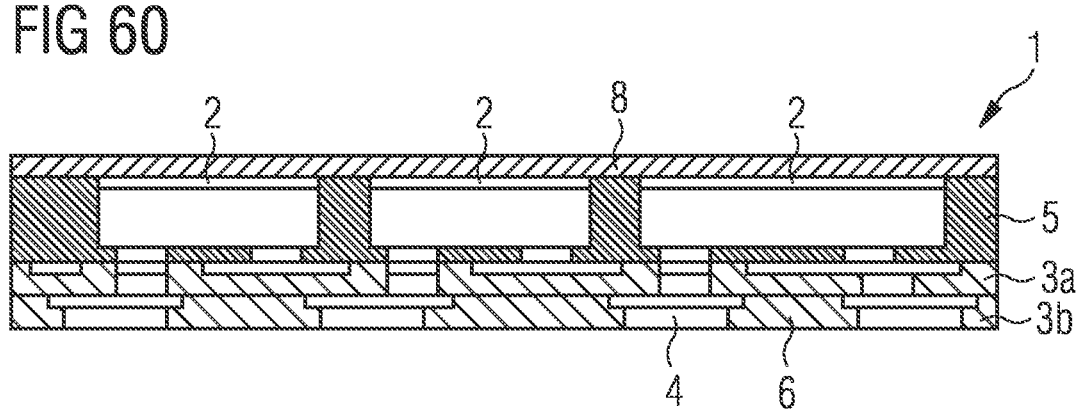
Figure 61:
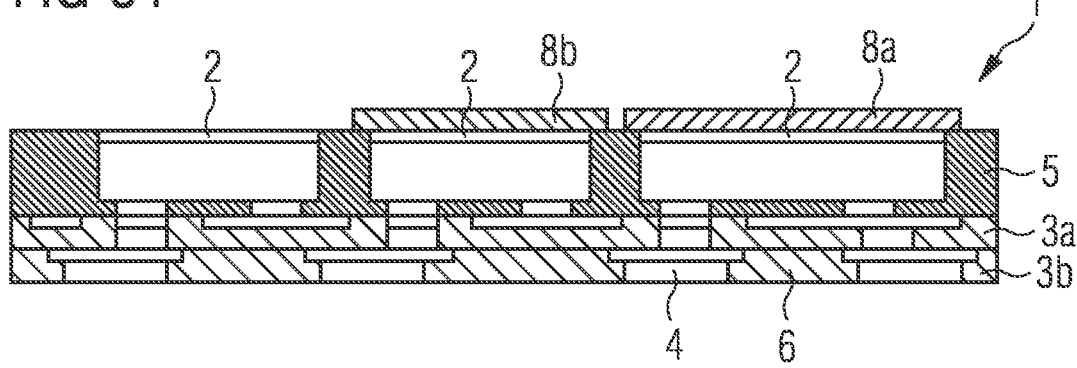
Figure 102:
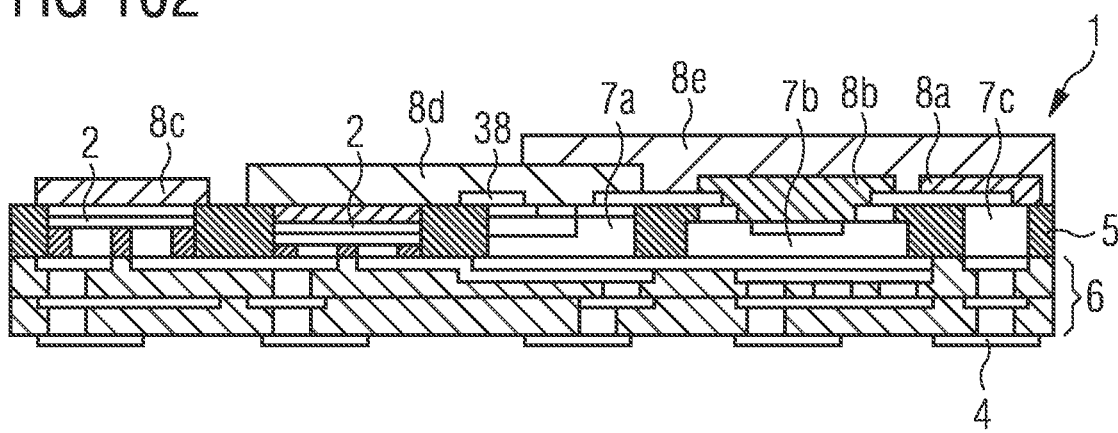
Figure 103:
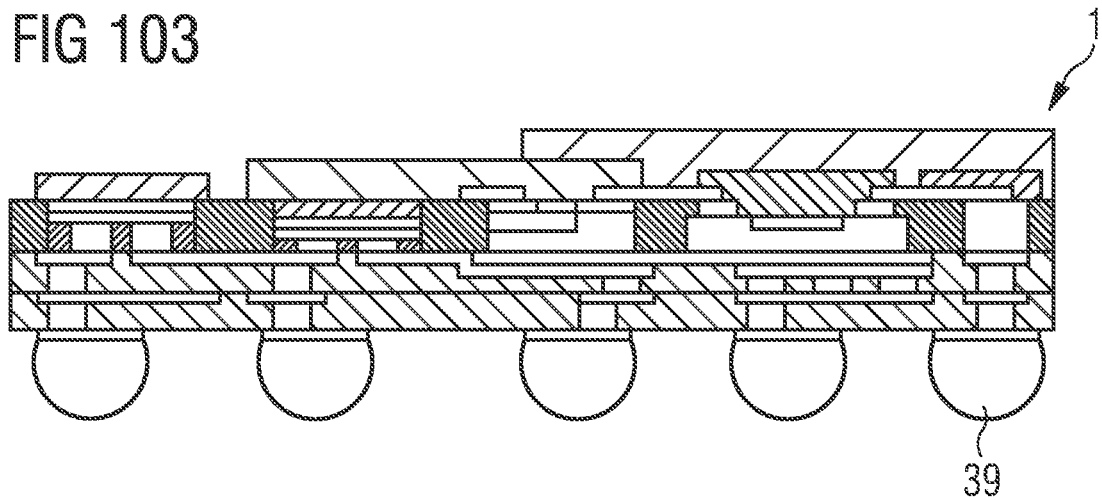
Figure 104:
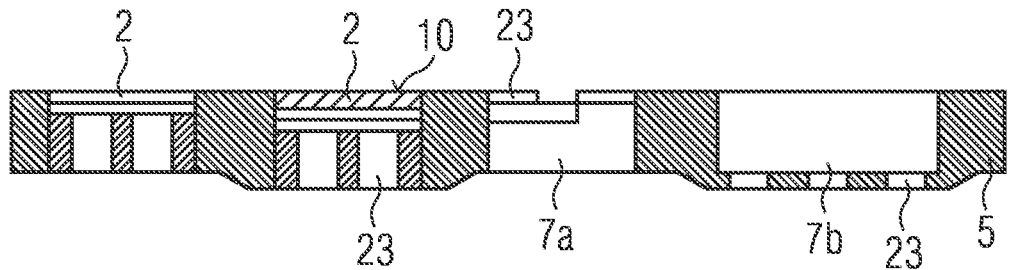
Figure 105:
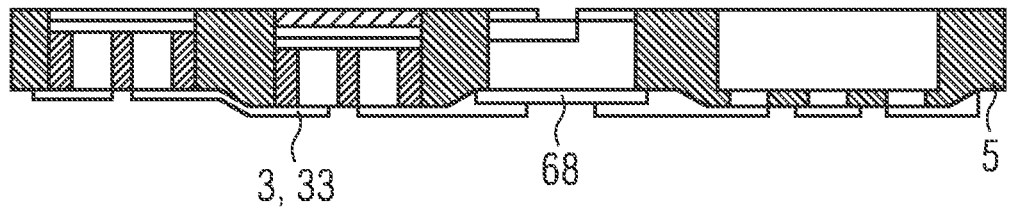
Figure 106:
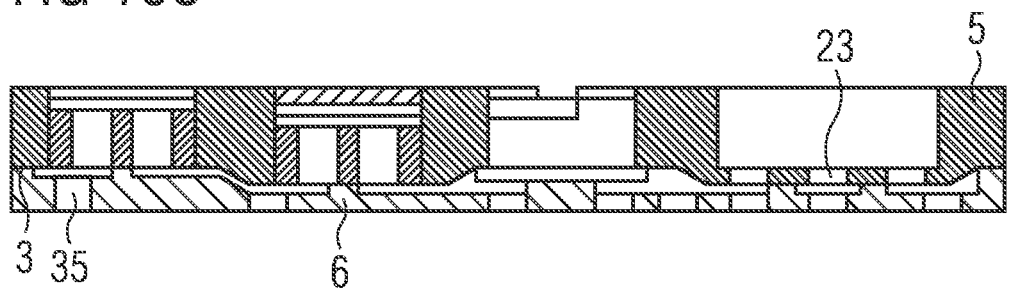
Figure 107:
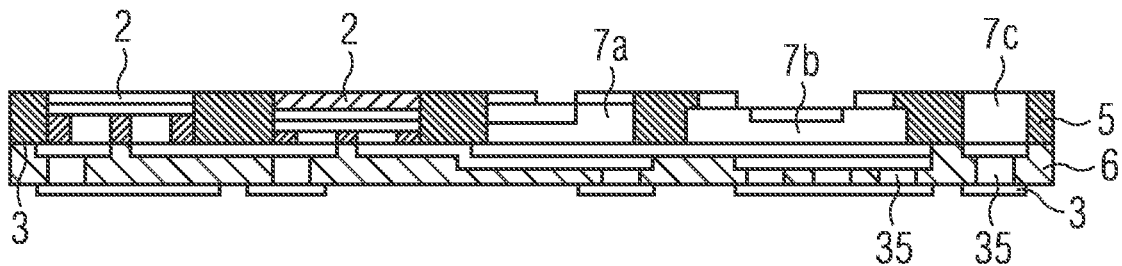
Figure 122:
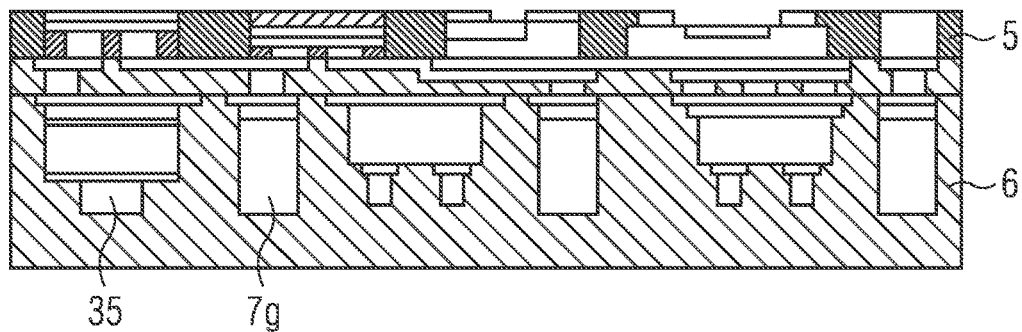
Figure 123:
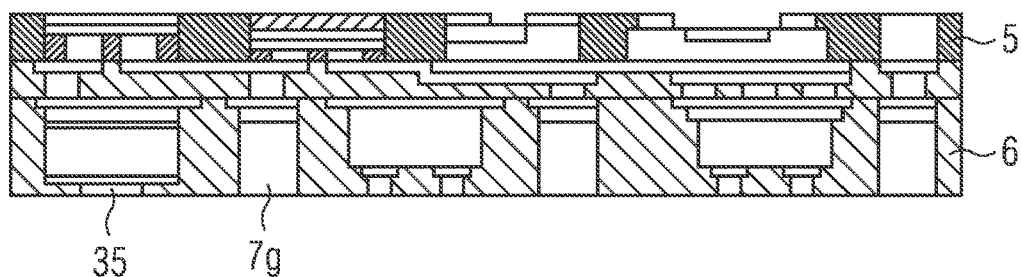
Figure 124:
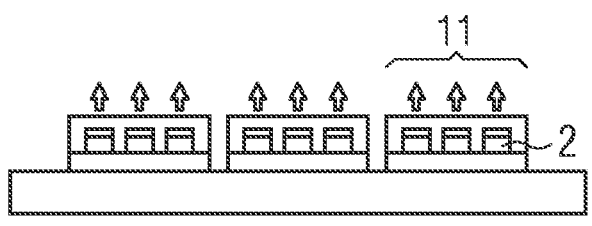
Figure 125:
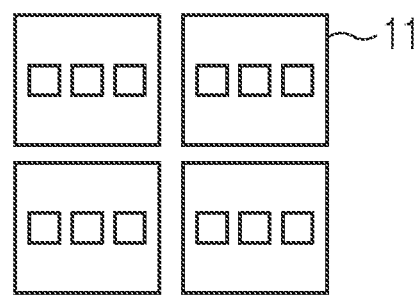
Figure 152:
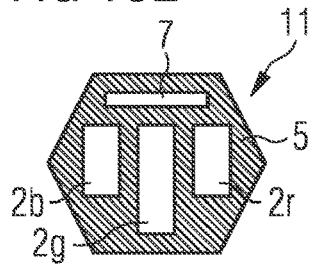
Figure 153:
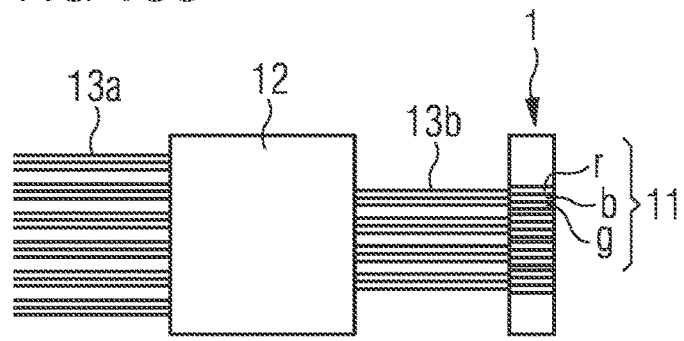

In the Figures:

FIGS. 1 to 7 show schematic sectional views of light-emitting semiconductor chips for semiconductor devices described herein, FIGS. 8 to 10 show schematic sectional views of exemplary embodiments of optoelectronic semiconductor devices described herein, FIGS. 11 to 17 show schematic sectional views of method steps of a method for manufacturing described herein, FIGS. 18 to 25 show schematic sectional views and subviews of steps of a method for manufacturing described herein, FIGS. 26 to 34 show schematic sectional views of steps of a method for manufacturing described herein, FIGS. 35 to 41 show schematic representations of steps of a method for manufacturing described herein, FIGS. 35 and 36 representing sectional views and FIGS. 37 to 41 representing subviews, FIGS. 42 to 45 show schematic sectional views and subviews of semiconductor chips for semiconductor devices described herein, FIGS. 46 to 53 show schematic sectional views of exemplary embodiments of semiconductor devices described herein, FIGS. 54 to 58 show schematic sectional views of steps of a method for manufacturing described herein, FIGS. 59 to 61 show schematic sectional views of exemplary embodiments of semiconductor devices described herein, FIGS. 62 to 74 show schematic plan views, sectional views and subviews of steps of a method for manufacturing described herein, wherein FIGS. 62, 65, 68 and 71 represent plan views of the sectional views of FIGS. 63, 66, 69 and 72 and FIGS. 64, 67, 70 and 73 represent associated subviews, and FIG. 74 shows a further sectional view, FIGS. 75 to 82 show schematic plan views, sectional views and subviews of steps of a method for manufacturing described herein analogous to FIGS. 62 to 67, FIGS. 83 to 89 show schematic sectional views and subviews of steps of a method for manufacturing described herein analogous to FIGS. 35 to 41, FIGS. 90 to 92 show schematic sectional views of exemplary embodiments of semiconductor devices described herein, FIGS. 93 to 103 show schematic sectional views of steps of a method for manufacturing described herein, FIGS. 104 to 106 show schematic sectional views of steps of a method for manufacturing described herein, FIGS. 107 to 114 show schematic sectional views of steps of a method for manufacturing described herein, FIGS. 115 to 123 show schematic sectional views of steps of a method for manufacturing described herein, FIGS. 124 and 125 show schematic sectional views and schematic plan views of a modification of a semiconductor device, FIGS. 126 to 134 show schematic sectional views of exemplary embodiments of semiconductor devices described herein, FIGS. 135 to 152 show schematic plan views of exemplary embodiments of semiconductor devices described herein, FIG. 153 shows schematic representation of driving an exemplary embodiment of a semiconductor device described herein, and FIGS. 154 to 159 show schematic plan views of exemplary embodiments of semiconductor devices described herein.

FIG. 1 illustrates a light-emitting semiconductor chip 2. The semiconductor chip 2 comprises an n-type layer 20$n$ and a p-type layer 20$p$, which together form a semiconductor layer sequence 20. The semiconductor layer sequence 20 is based, for example, on the material system AlInGaN and is preferably configured to generate blue light.

The semiconductor layer sequence 20 is electrically contacted via electrical contact pads 23$p$, 23$n$. The contact pads 23$p$, 23$n$ are connected to the semiconductor layer sequence 20 via a metallization 26 as well as via electrically conductive layers 24. To avoid electrical short circuits, electrically insulating layers 25 are provided.

Furthermore, the contact pads 23$p$, 23$n$ are embedded in a chip potting 62. The contact pads 23$p$, 23$n$ may be flush with the chip potting 62. Optionally, the chip potting 62 comprises an admixture 61, for example color pigments or particles for adjusting thermal or also mechanical properties. A light exit side 10 is opposite a main side with contact pads 23$p$, 23$n$.

Figure 2:
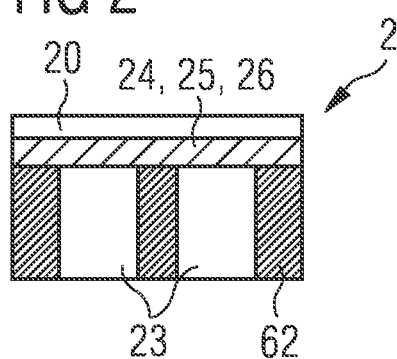

In FIG. 2 the semiconductor chip 2 of FIG. 1 is shown schematized and simplified. In the following, the representation of the semiconductor chip 2 is based on FIG. 2 and not on FIG. 1, unless otherwise indicated.

Figure 3:
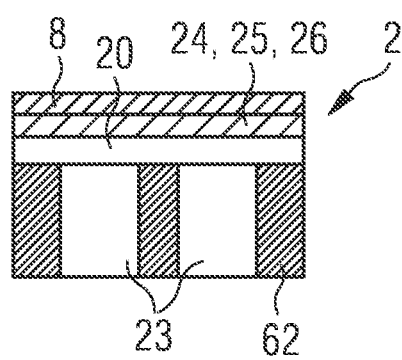
Figure 4:
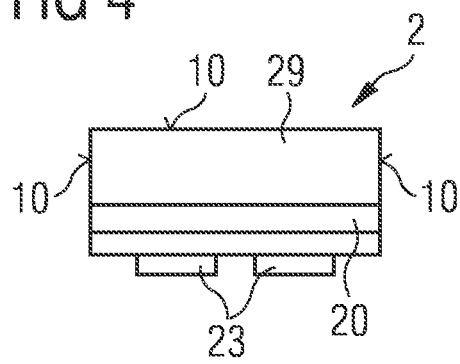

The semiconductor chip 2 of FIG. 3 may additionally comprise a coating 8. The coating 8 is preferably a phosphor layer. The coating 8 may constitute the entire light exit side 10.

The semiconductor chips 2, as shown in FIGS. 1 to 3, may each be free of a growth substrate for the semiconductor layer sequence 2. In contrast, in FIG. 4, the growth substrate 29 is still on the semiconductor layer sequence 20.

Figure 5:
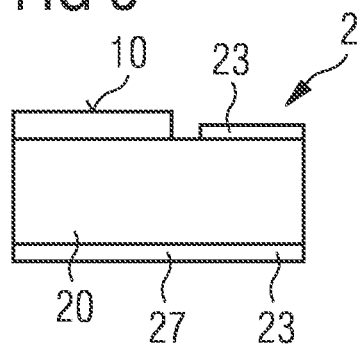

In FIG. 5, a semiconductor chip 2 is illustrated whose one electrical contact pad 23 is located at the light exit side 10, while the other contact pad 23 is located opposite the light exit side and simultaneously represents a mounting layer 27. The mounting layer 27 is, for example, a metal layer which can be soldered on. Thus, according to FIG. 5, it is not a flip chip, in contrast to FIGS. 1 to 4.

The semiconductor chip 2 of FIG. 6 comprises several pixels 22. The pixels 22 are preferably electrically independently controllable. The semiconductor layer sequence 20 can be patterned to the pixels 22 and is then preferably electrically connected accordingly.

According to FIG. 6, the pixels 22 and thus the semiconductor layer sequence 20 make up essentially the entire light exit side 10. Deviating from this, it is shown in FIG. 7 that the semiconductor chip 2 can be larger overall than the pixelated semiconductor layer sequence 20.

This is possible, for example, by a structure similar to that shown in FIG. 1.

The semiconductor chips 2 shown in connection with FIGS. 1 to 7 may be used in each of the exemplary embodiments of optoelectronic semiconductor devices 1 described herein. The semiconductor chips 2 may each be flip chips or, as illustrated in FIG. 5, semiconductor chips whose electrical contacts are located on two opposite sides. Flip chips are preferred, however.

Furthermore, the semiconductor chips 2 can each be surface emitters which essentially emit light only on the light exit side 10. Likewise, volume emitters can also be used, especially for semiconductor chips similar in structure to FIG. 4.

FIG. 8 illustrates an exemplary embodiment of the semiconductor device 1. In addition to the semiconductor chip 2, the semiconductor device 1 comprises a base body 5. The base body 5 is opaque, for example reflective, in particular white. The base body 5 completely encloses side surfaces of the semiconductor chip 2 and is approximately flush with the light exit side 10. Furthermore, the base body 5 preferably terminates flush with the contact pads 23.

On a side facing away from the light exit side 10, electrical conductor tracks 33 of an electrical fanning layer 3 are located on the base body 5. The conductor tracks 33 are preferably metallic in each case and are connected to the contact pads 23. Such a fanning layer 3 can also be referred to as a fan-out.

Starting from the conductor tracks 33, electrical connection pads 4 are provided for external electrical contacting of the semiconductor device 1. The connection pads 4 are also preferably formed by one or more metals, for example nickel, NiAu or AuSn.

The conductor tracks 33 and the connection pads 4 are jointly embedded in an embedding body 6. The embedding body 6 preferably terminates flush with the connection pads 4 in the direction away from the semiconductor chip 2. The embedding body 6 is formed directly at the base body 5.

In the exemplary embodiment of FIG. 9, it is illustrated that an optically effective coating 8 may additionally be present. The coating 8 is, for example, a phosphor layer. The coating 8 preferably completely covers the semiconductor chip 2 and the base body 5 as seen in plan view.

According to FIG. 10, the semiconductor chip 2 is a pixelated chip with a plurality of pixels 22. Electrical interconnection takes place in two fanning layers 3.

FIGS. 11 to 17 illustrate a method for manufacturing. According to FIG. 11, the semiconductor chip 2 is provided. For example, the semiconductor chip 2 is constructed as explained in FIGS. 1 and 2. Alternatively, the semiconductor chips of FIG. 3, 4, 6 or 7 may be used.

Figure 12:
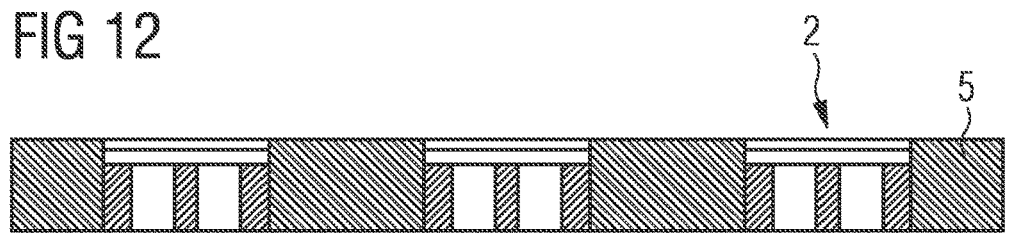

In the step of FIG. 12, the base body 5 is created. This is done, for example, by pressing, injection molding, spraying or casting. In particular, the base body 5 is created by means of film assisted injection molding, also referred to as film assisted molding. The base body 5 preferably includes many of the semiconductor chips 2, for example in the form of a wafer or fabrication compound, and is therefore also referred to hereinafter as a base body compound. As in all other exemplary embodiments, a method such as compression molding, transfer molding and foil assisted molding may also be used to generate the base body 5 and/or the embedding body 6.

For example, the base body 5 is a silicone to which particles such as reflective metal oxide particles, in particular of titanium dioxide, are added. Alternatively, the base body 5 can also be colored, for example black. Furthermore, it is possible to use an epoxy or other plastic for the base body 5. This applies in particular if side surfaces of the semiconductor layer sequence 20 are mirrored, so that no light or no significant light fraction reaches the base body 5 from the semiconductor chips 2.

Figure 13:
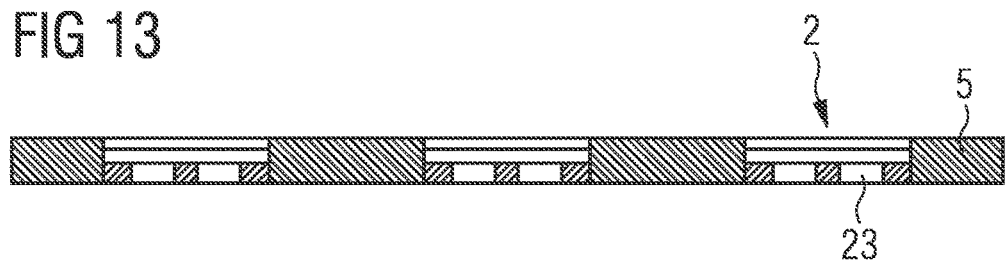

In the optional step of FIG. 13 the arrangement of FIG. 12 is thinned. This is done from the side of the contact pads 23.

Figure 14:
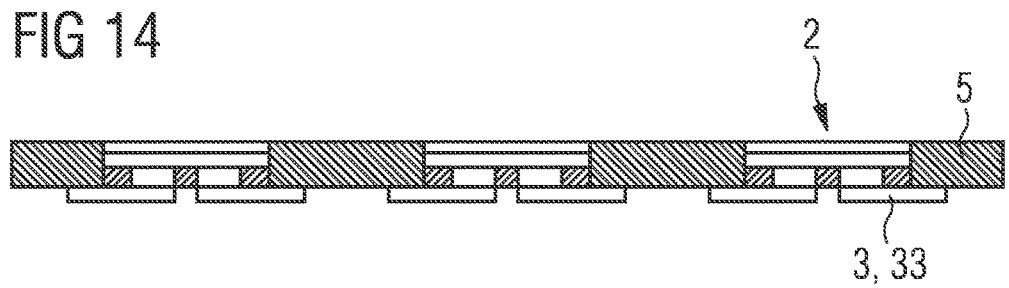

FIG. 14 illustrates that the conductor tracks 33 for the fanning layer 3 are applied. This is preferably done in a structured manner using masks which are not drawn, for example from a photoresist.

Figure 15:
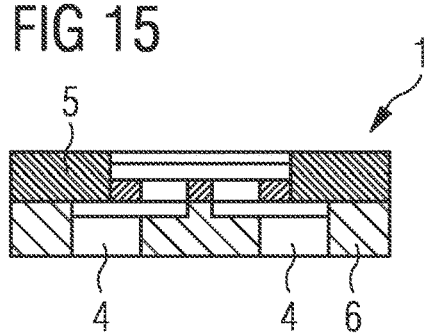

The connection pads 4 are then produced, for example from nickel, see FIG. 15. The connection pads 4 are produced, for example, by electroplating. On a side facing away from the semiconductor chip 2, the connection pads 4 preferably comprise a contact coating, not drawn. The contact coating is comparatively thin and made of palladium, platinum, gold and/or tin, for example.

The embedding body 6 is then formed, see also FIG. 15. The embedding body 6 is, for example, made of an epoxy or another plastic. Furthermore, it is possible that a photoresist is used for the embedding body 6, which is used, for example, to create the connection pads 4 in a structured manner.

Alternatively, the contact coating can be applied after the embedding body 6 has been created.

Thereupon, the individual semiconductor devices 1 are created by singulating them from the base body composite, as shown in FIG. 15. The finished semiconductor device 1 can be surface-mounted by means of the connection pads 4.

Figure 16:
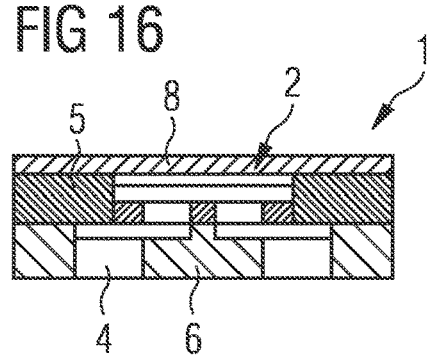

In the step of FIG. 16, it is shown that the coating 8 is applied over the entire surface, for example by means of spray coating. The coating 8 is preferably a luminescent material. Other methods to apply the coating 8 are for example layer transfer, wafer level screen printing and/or foil printing or lamination.

Figure 17:
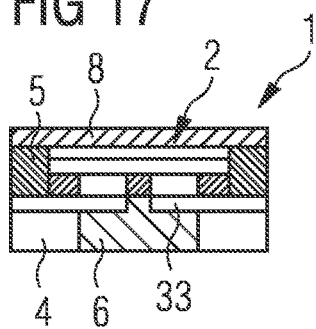

FIG. 17 shows an alternative arrangement of the connection pads 4. Thus, the connection pads 4 according to FIG. 17 are located at side edges and side surfaces of the semiconductor device 1. In contrast, the connection pads 4 in the design of FIG. 16 are located inside the embedding body 6 as seen in bottom view.

Thus, in comparison with a comparable semiconductor device according to FIG. 16, a semiconductor device according to FIG. 17 can be manufactured smaller in lateral dimensions with otherwise identical properties and thus usually also more cost-efficiently.

Figure 18:
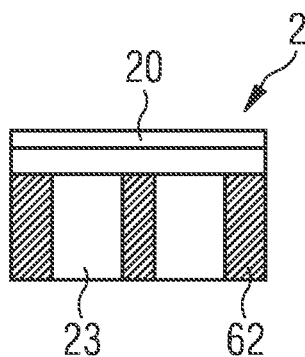
Figure 19:
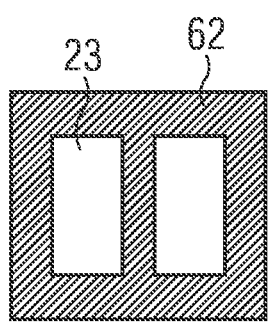

FIGS. 18 to 25 relate to a further example of a method for manufacturing. In FIG. 18, the semiconductor chip 2 is shown in a sectional view, analogous to FIG. 2. A bottom view is shown in FIG. 19.

In order to achieve the highest possible yield from an epitaxial process, the semiconductor layer sequence 20 per semiconductor chip 2 is as small as possible. This makes it possible to manufacture the semiconductor chips 2 at low cost. Likewise, due to the small light-emitting area of the semiconductor layer sequence 2, improved optical imaging is possible, in particular with regard to the Étendue. Thus the contact pads 23 comprise a comparatively small distance from one another, which is, for example, only 100 µm or 70 µm or 60 µm or 50 µm.

Figure 20:
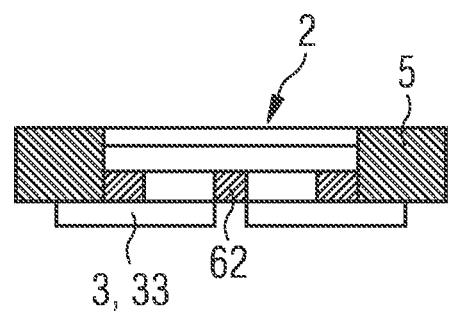
Figure 21:
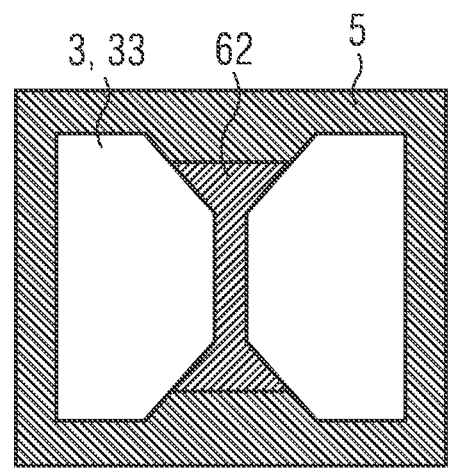

In the sectional view of FIG. 20 and the bottom view of FIG. 21, the conductor tracks 33 of the fanning layer 3 are illustrated. The conductor tracks 33 are preferably applied after a thinning process and extend from the contact pads 23 in the direction towards an edge of the base body 5.

Figure 22:
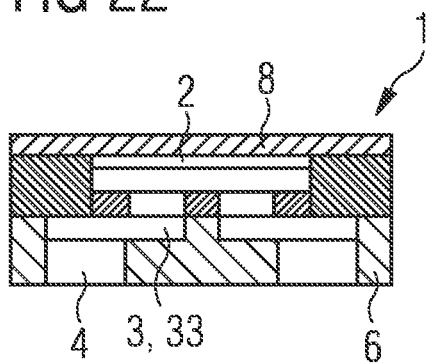
Figure 23:
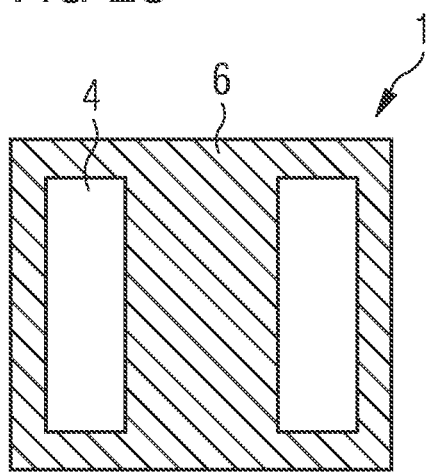

It is thus possible, see the sectional view of FIG. 22 and the bottom view of FIG. 23, for the connection pads 4 to comprise a greater distance from one another, for example a distance of 250 µm. Such a distance is necessary, for example, for surface mounting in order to avoid electrical short circuits caused by a solder material or by an electrically conductive adhesive.

Thus, the fanning layer 3 allows a geometry of the connection pads 4 to be expanded relative to a geometry of the contact pads 23. Thus, small semiconductor chips 2 can be used and, at the same time, larger and widely spaced connection pads 4 can be generated at low cost. In addition, the separation of the connection pads 4 from the semiconductor chip 2 by the fanning layer 3 makes it possible to mechanically decouple the semiconductor chip 2 from the connection pads 4. This makes it possible to reduce thermal stresses on the semiconductor chip 2, such as those that occur when the semiconductor device 1 is soldered to a carrier that is not drawn. In addition, a larger-area thermal connection of the semiconductor chip 2 to an external, non-drawn carrier can be realized.

Furthermore, the fanning layer 3 and the embedding body 6 can be designed to be comparatively thin and, in particular, comprise a smaller thickness than the semiconductor chip 2 itself. Thus, there is no significant increase in a thickness of the semiconductor device 1 compared to the semiconductor chip 2.

A lateral size of the semiconductor device 1 can be adapted to the requirements for the size of the connection pads 4. Thus, a size of the semiconductor device 1 is substantially limited by the requirements for the connection pads 4. Thus, the semiconductor device 1 comprises a base surface only slightly larger than the semiconductor layer sequence 20 and the semiconductor chip 2.

Figure 24:
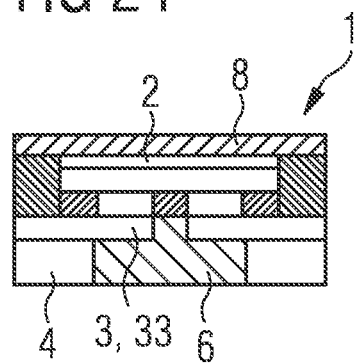
Figure 25:
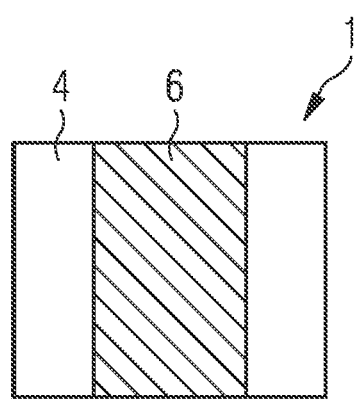
Figure 26:
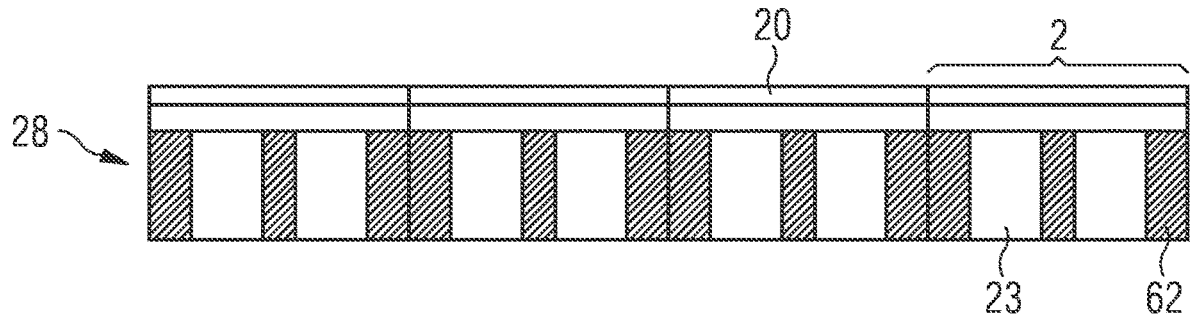

FIGS. 24 and 25 correspond to FIGS. 22 and 23, respectively, with the connection pads 4 provided on opposite edges of the embedding body 6. Thus, the component of FIGS. 24 and 25 corresponds to the component of FIG. 17.

Again, the coating 8 may optionally be present, for example formed by a phosphor layer.

FIGS. 26 to 34 explain another example of the method for manufacturing. According to FIG. 26, a wafer 28 is provided, preferably consisting of the semiconductor chips 2. In the wafer 28, the semiconductor layer sequence 20 may still be substantially complete. Likewise, the contact pads 23 as well as the chip potting 62 are preferably still produced in the wafer composite.

Figure 27:
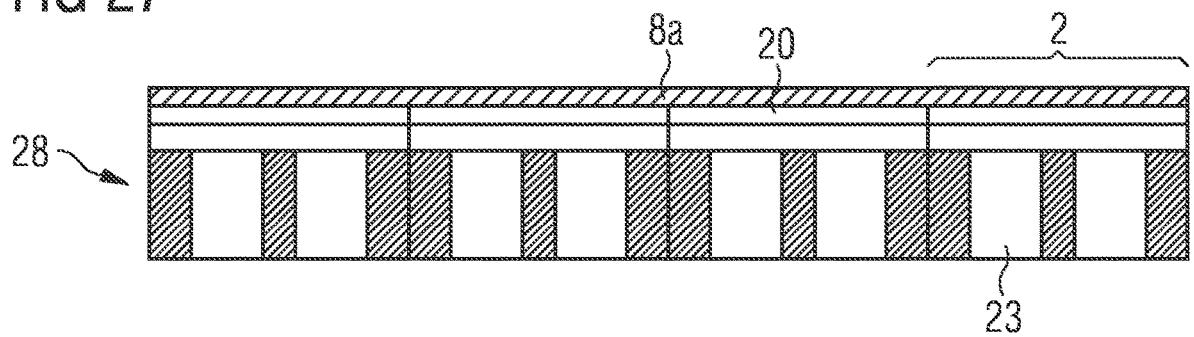

In the optional step of FIG. 27, the coating 8 is applied. The coating 8 is, for example, again at least a phosphor layer.

Figure 28:
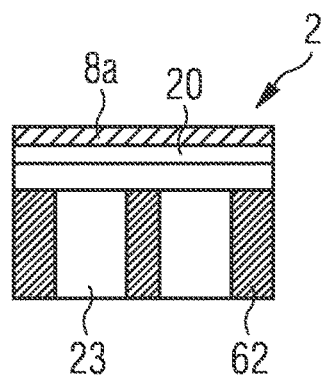
Figure 29:
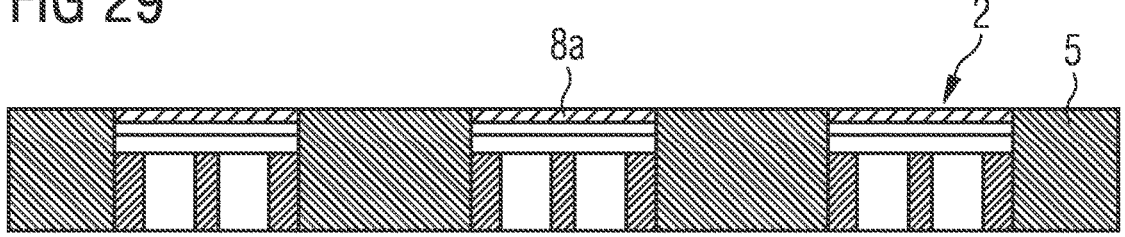
Figure 30:
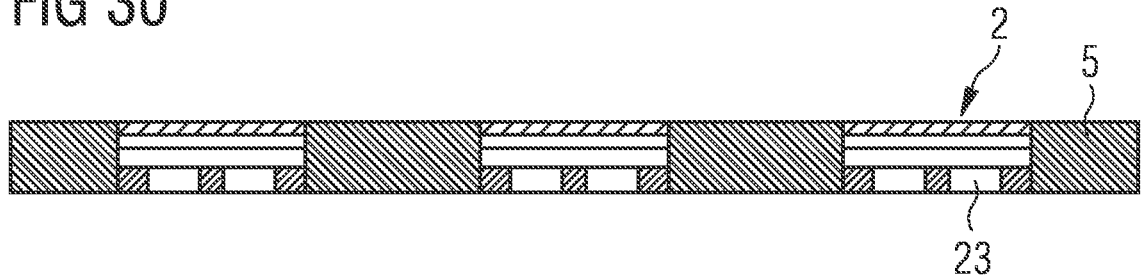
Figure 31:
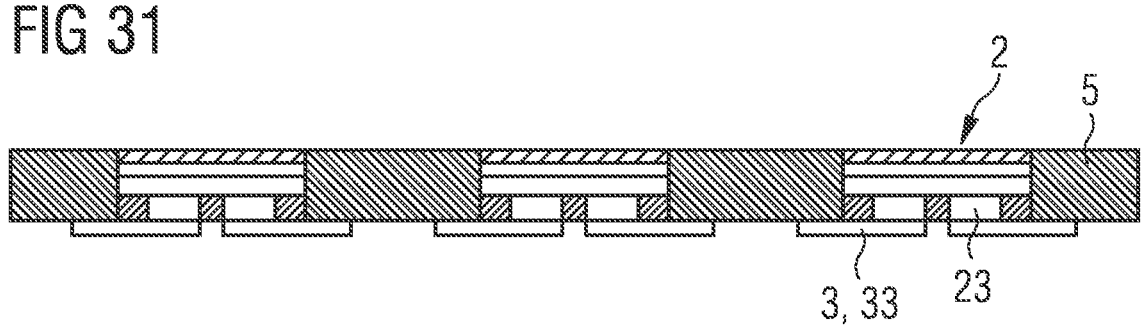

In FIG. 28 it is shown that a singulation of the wafer 28 to the semiconductor chips 2 takes place.

The steps of FIGS. 29 to 34 are essentially analogous to the steps of FIGS. 12 to 17. Thus, according to FIG. 29, the base body 5 is produced, which can be laterally flush with the coating 8, for example. In the optional step shown in FIG. 30, the contact pads 23, the chip potting 62 and the base body 5 are thinned. The conductor tracks 33 are then generated, see FIG. 31.

Figure 32:
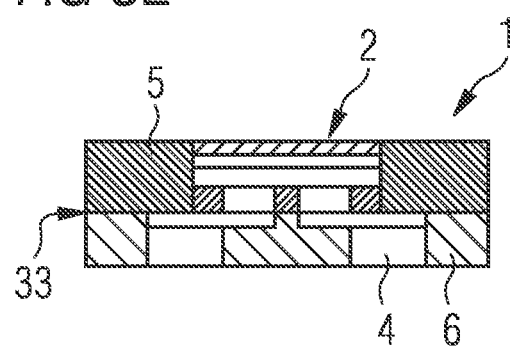

Subsequently, the connection pads 4 and the embedding body 6 are created and the base body composite is separated to form the semiconductor devices 1, see FIG. 32.

In an optional method step, a further coating 8b is applied in addition to the phosphor layer 8a, see FIG. 33. The coating 8b is, for example, a light-scattering layer, i.e. a diffuser layer. Again, the connection pads 4 need not be embedded in the embedding body 6, as seen from an underside, but can also be located at an edge. This is illustrated in FIG. 34.

In the method for manufacturing of FIGS. 35 to 40, a pixelated semiconductor chip 2 is used, see FIG. 35. The individual pixels 22 are electrically connected via several fanning layers 3a, 3b, 3c and connected to the connection pads 4. Electrical vias 35 are located between the fanning layers 3a, 3b, 3c.

The embedding body 6 is composed of three partial layers 66. Each of the partial layers 66 corresponds to one of the fanning layers 3a, 3b, 3c with the associated vias 35. The partial layers 66 are preferably produced sequentially, see also FIG. 36.

Figure 37:
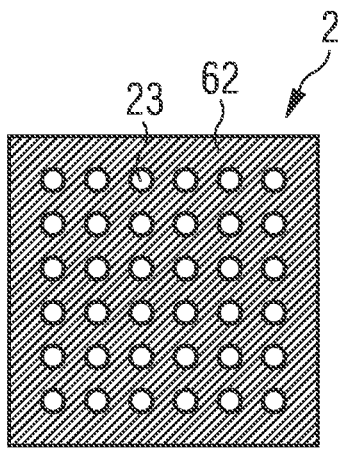

In FIG. 37, a bottom view of the contact pads 23 of the semiconductor chip 2 is shown. A pitch of the contact pads 23 is comparatively small and is, for example, 100 µm.

Figure 38:
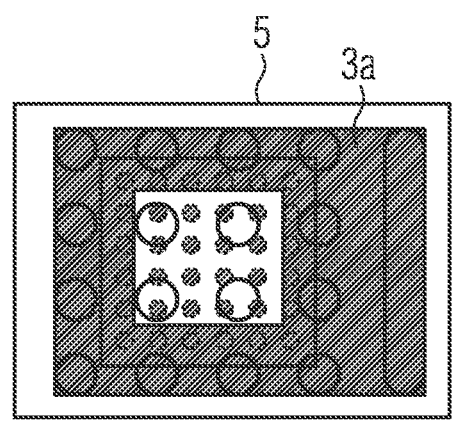
Figure 39:
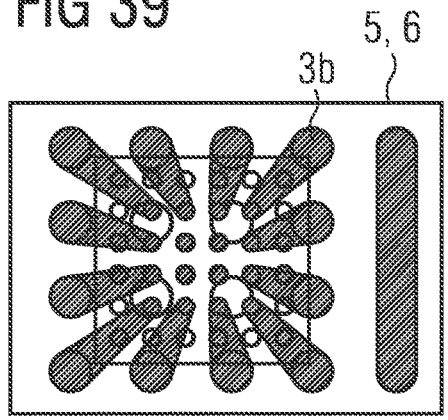
Figure 40:
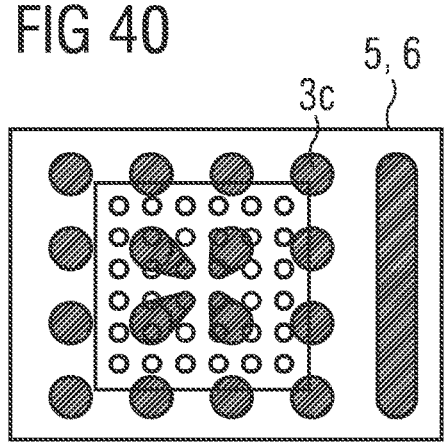
Figure 41:
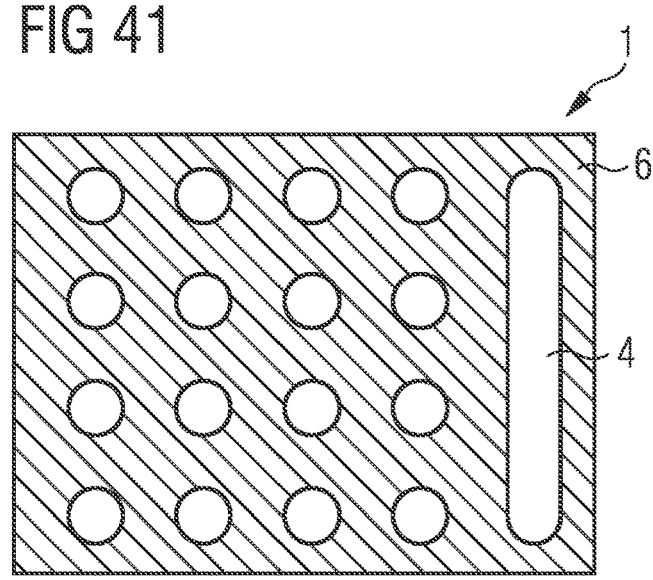

FIGS. 38 to 40 illustrate the fanning layers 3a, 3b, 3c. Starting from the contact pads 23, a spacing of the connection pads 4 is increased, for example to 250 µm. The corresponding connection pads 4 can be seen in FIG. 41.

Due to the fanning layers 3, the contact pads 23 of the semiconductor chip 2 can be designed in various ways, but the same configuration of the connection pads 4 can always be used.

Figure 42:
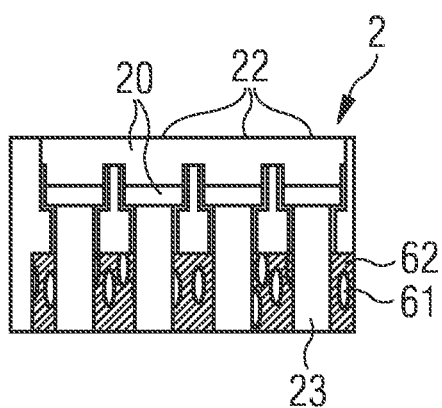
Figure 43:
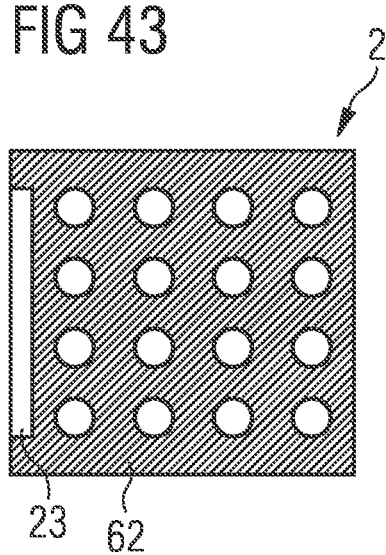

In FIGS. 42 and 43, another possible configuration of the semiconductor chip 2 is shown, see the sectional view of FIG. 42 and the bottom view of FIG. 43. A separate contact pad 23 is provided for each pixel. In addition, a common contact pad 23 is provided as a counter electrode for all pixels 22. This common contact pad 23 is located, for example, on an edge of the underside of the semiconductor chip 2.

Figure 44:
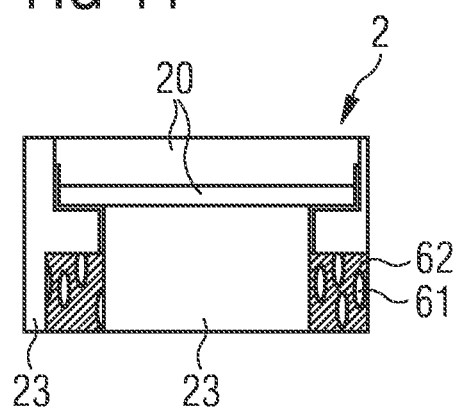
Figure 45:
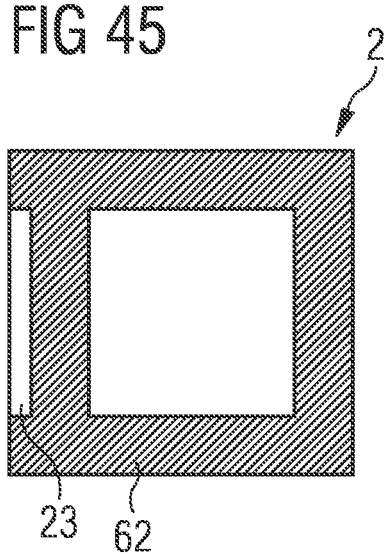

If no pixelated semiconductor chip 2 is present, see FIGS. 44 and 45, a central contact pad can be designed to be comparatively large in order to ensure efficient heat dissipation out of the semiconductor chip 2. This is shown in the bottom view of FIG. 45.

FIGS. 46 to 53 illustrate further exemplary embodiments of the semiconductor device 1. In each case, a pixelated semiconductor chip 2 is used.

Figure 46:
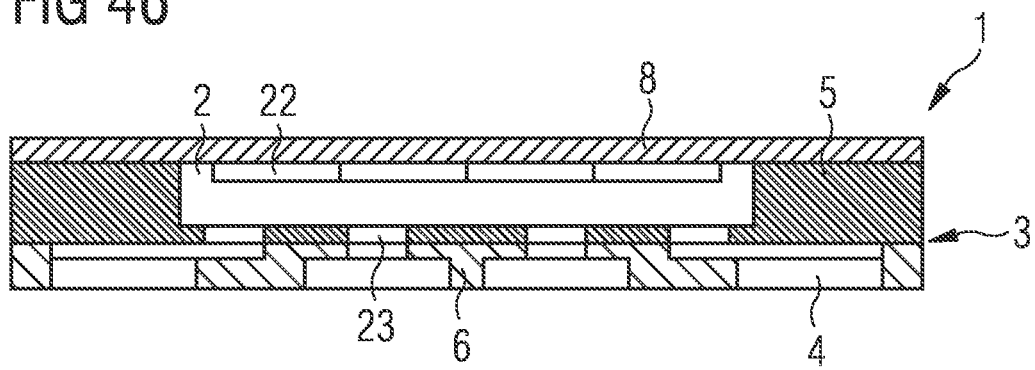
Figure 47:
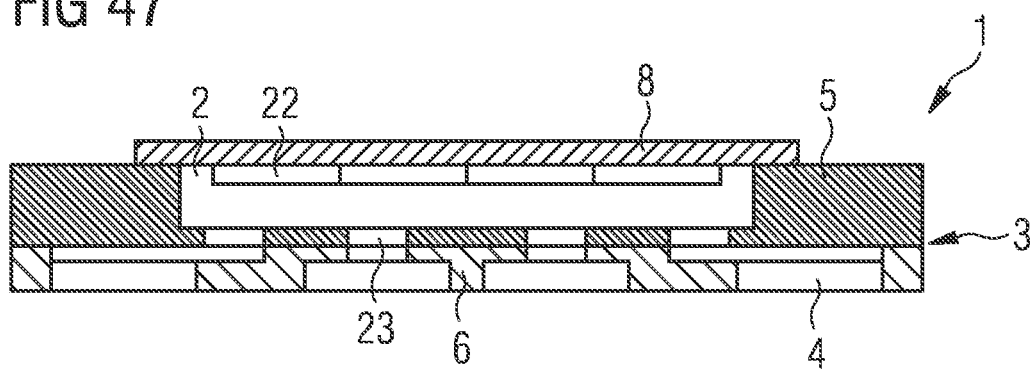

According to FIG. 46, the coating 8 is jointly arranged downstream of the pixels 22 and the base body 5. According to FIG. 47, the coating 8, which is for example a phosphor layer, is essentially limited to the semiconductor chip 2. A protrusion of the coating 8 over the semiconductor chip 2 is preferably small, for example at most 20% or 10% of an edge length of the semiconductor chip 2. Alternatively, the coating 8 can also be flush with the semiconductor chip 2, as is also possible in all other exemplary embodiments.

Figure 48:
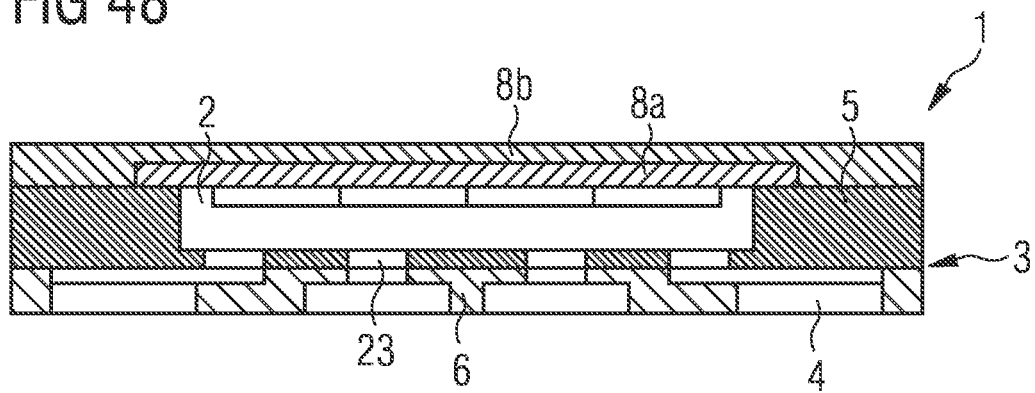

In FIG. 48, it is shown that in addition to the phosphor layer 8a, a diffuser layer 8b is provided as a coating. The coating 8b completely covers the coating 8a. The coating 8b can be laterally flush with the base body 5 and towards the connection pads 4 flush with the phosphor layer 8a.

Figure 49:
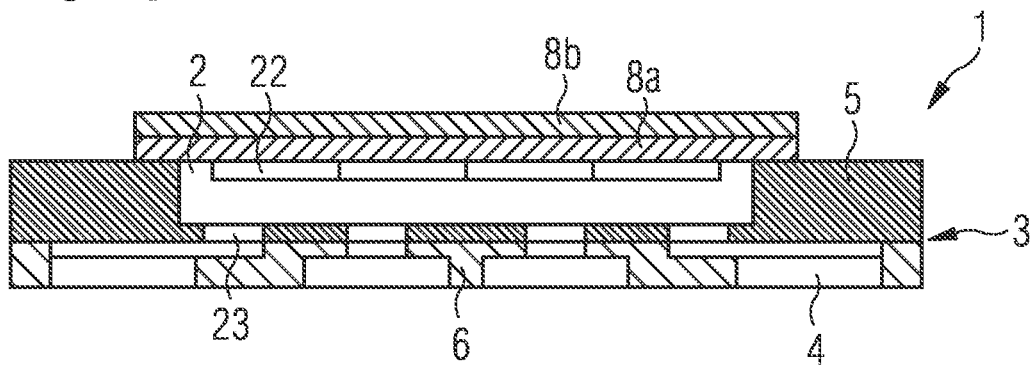

In FIG. 49, the two phosphor layers 8a, 8b are arranged in particular congruently one above the other.

Figure 50:
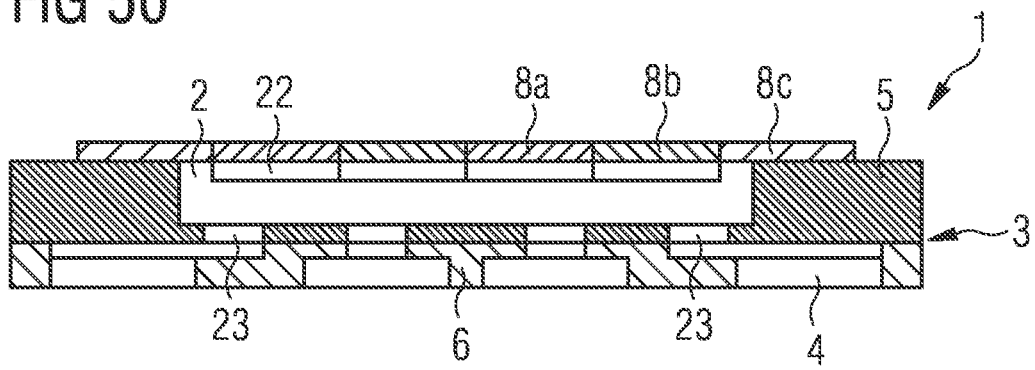
Figure 51:
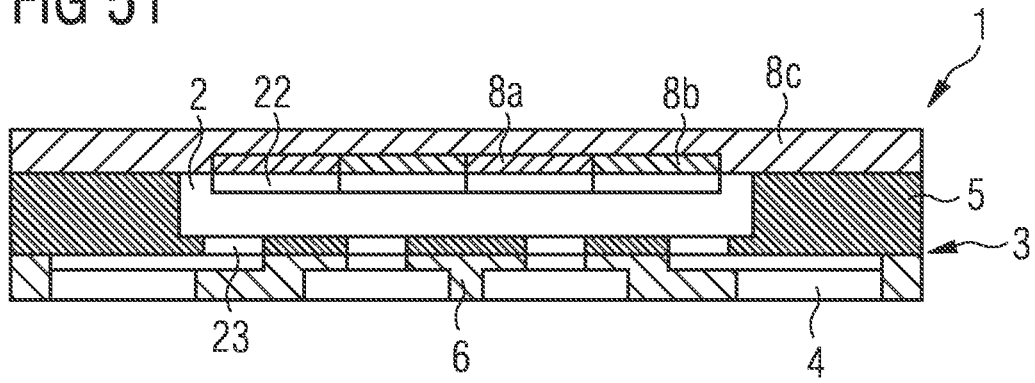

In FIG. 50 it is shown that the phosphor layers 8a, 8b are congruently assigned to the respective pixels 22. Optionally, the diffuse-acting and/or white-appearing coating 8c is located at an edge around the phosphor layers 8a, 8b. The diffuser coating 8c can also cover the phosphor layers 8a, 8b and thus the pixels 22, see FIG. 51.

Figure 52:
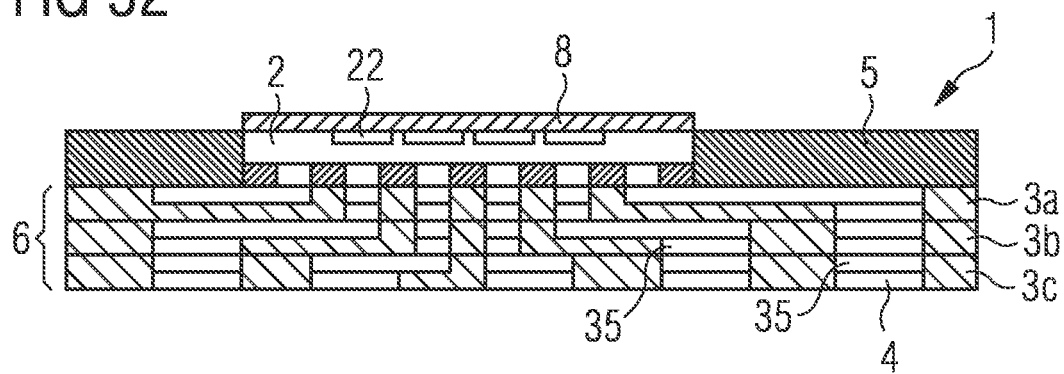

The example of FIG. 52 is substantially the same as that of FIG. 36, with the phosphor layer 8 being flush with the semiconductor chip 2 and overhanging the embedding body 5.

Figure 53:
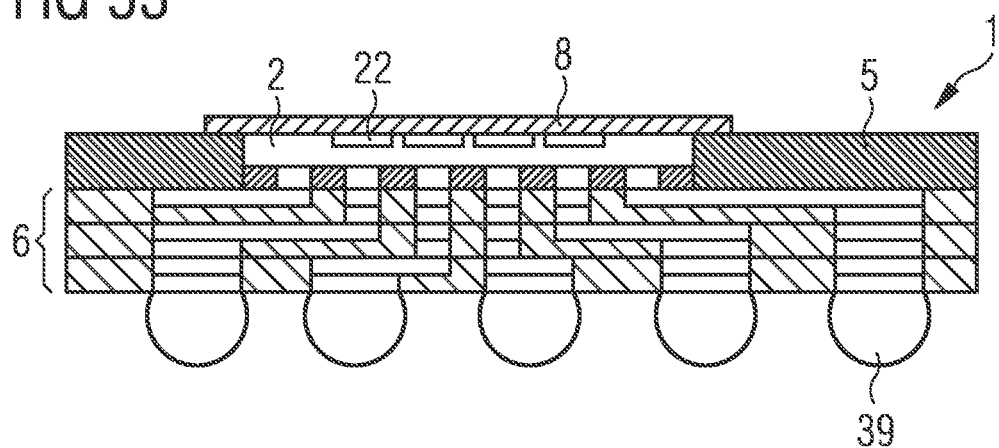
Figure 54:
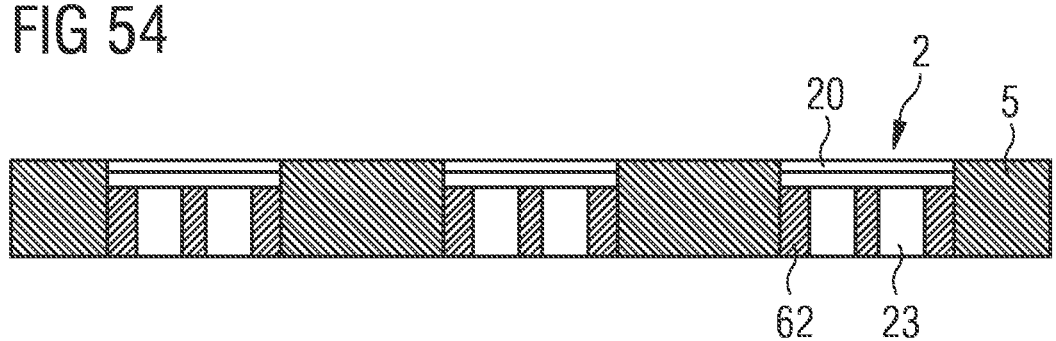
Figure 55:
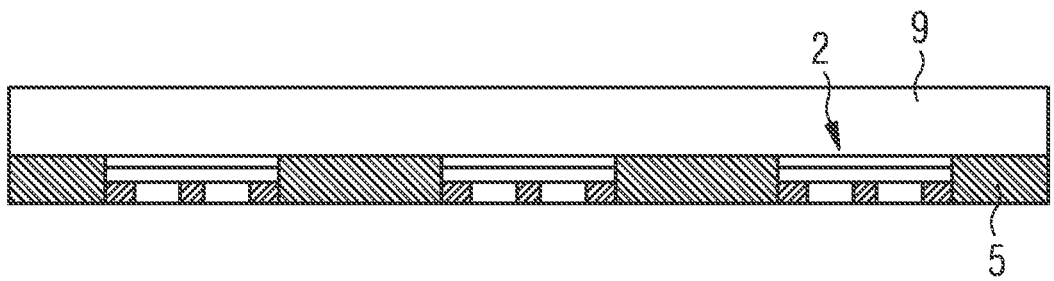

In FIG. 53, it is illustrated that contact balls 39 may be present. The contact balls 39 are associated with the connection pads 4. The contact balls 39 are made of SnAgCu, for example. This makes it possible to achieve a solderable, regular arrangement of contacts which can project significantly beyond the embedding body 6 in the direction away from the semiconductor chip 2. Such an arrangement is also known as a ball grid array, or BGA. Such contact balls 39 may also be present in all exemplary embodiments.

In the method for manufacturing of FIGS. 54 to 58, an auxiliary carrier 9 is used. First, the base body composite, i.e. the arrangement of the semiconductor chips 2 in the base body 5, is provided, see FIG. 54. Subsequently, the auxiliary carrier 9 is attached, see FIG. 55.

Optionally, the base body composite is thinned, preferably after the auxiliary carrier 9 has been attached, so that it provides sufficient mechanical stability during thinning and in the subsequent method steps. In this way, particularly thin semiconductor devices can be produced.

Figure 56:
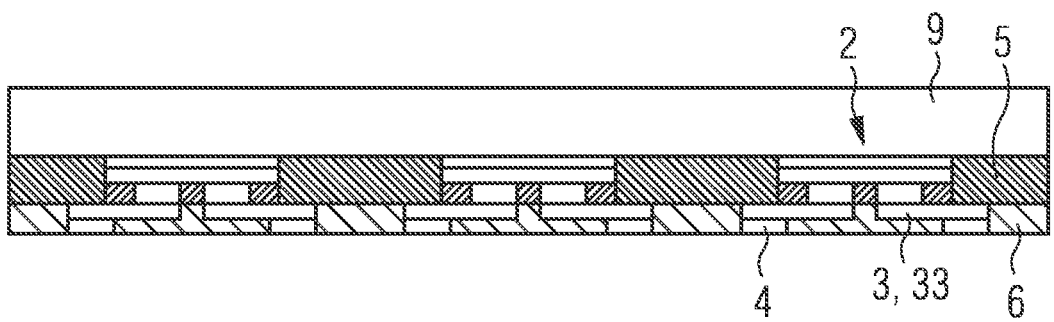

The fanning layer 3 with the conductor tracks 33 is then created and the connection pads 4 and the embedding body 6 are produced, see FIG. 56.

According to FIG. 57, a singulation to the semiconductor devices 1 with, for example, one semiconductor chip 2 each still takes place at the auxiliary carrier 9. The singulation can extend into the auxiliary carrier 9, so that a material of the auxiliary carrier 9 between adjacent semiconductor devices 1 is partially removed. The singulation is performed, for example, by means of sawing or laser cutting.

Thereafter, the auxiliary carrier 9 is detached so that the semiconductor devices 1 remain, see FIG. 58.

As in all exemplary embodiments, it is possible for the embedding body 6 and/or the base body 5 to comprise an admixture, analogous to the chip potting 62. The admixture is boron nitride, for example, in order to achieve increased thermal conduction. Titanium dioxide particles and/or aluminum oxide particles may be used to improve a reflection.

Absorbent materials, for example UV absorbers such as carbon black, or dyes or mixtures thereof can also be used.

Instead of casting, spraying or pressing, the embedding body 6 can also be produced by gluing on a dielectric foil. Openings for the connection pads 4 and/or the vias 35 can be created via a laser drilling process, for example. Such drill holes can be filled with metal after a cleaning step. Such a process can be repeated several times to sequentially build up the fanning layers 3 and the embedding body 6.

FIGS. 59 to 61 show further exemplary embodiments of the semiconductor devices 1. In these exemplary embodiments, the semiconductor devices 1 each comprise a plurality of the semiconductor chips 2. In each case, there may be only semiconductor chips 2 of the same design, or there may be semiconductor chips 2 of different designs, as symbolized by the different sizes of the semiconductor chips 2 in FIG. 59. Thus, the semiconductor chips 2 may emit in different colors or all comprise the same emission color, for example blue or near ultraviolet. Red, green and blue emitting semiconductor chips 2 may also be combined.

In FIG. 60, it is illustrated that the semiconductor chips 2 are jointly followed by the coating 8, for example a diffuser layer.

In FIG. 61 it is shown that different semiconductor chips 2 are assigned different phosphor layers 8a, 8b. Some of the semiconductor chips 2 may be free of the coating 8. This makes it possible to realize red, green as well as blue emitting semiconductor devices 1 with semiconductor chips 2 of identical construction. The semiconductor devices 1 can thus be RGB devices. The same is possible in all other exemplary embodiments.

FIGS. 62 to 74 illustrate a further method for manufacturing. The illustration is based on the illustration of FIGS. 18 to 25. FIGS. 62, 65, 68 and 71 are plan views, FIGS. 63, 66, 69 and 72 are schematic sectional views and FIGS. 64, 67, 70, 73 are bottom views.

Figure 62:
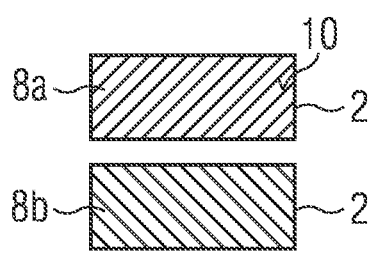
Figure 65:
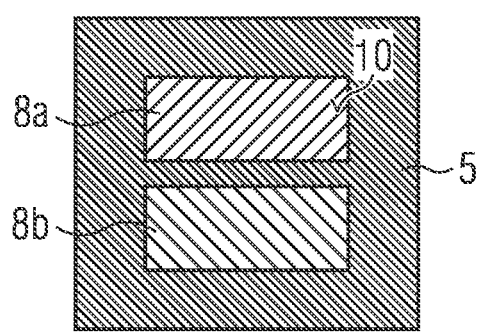
Figure 63:
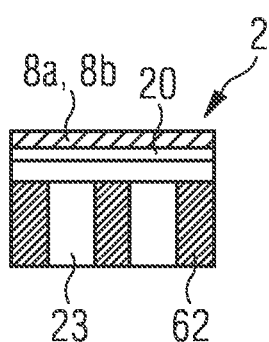
Figure 66:
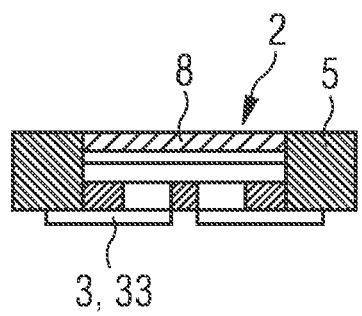
Figure 64:
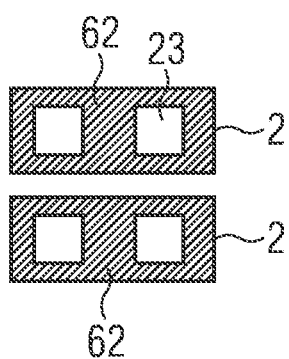
Figure 67:
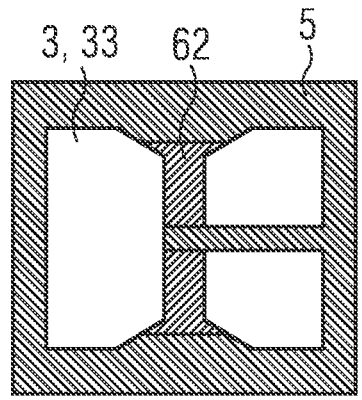

FIGS. 62, 63 and 64 illustrate the two semiconductor chips 2, which are followed by various phosphors 8a, 8b. The associated fanning layer 3 is shown in connection with FIGS. 66 and 67.

Figure 68:
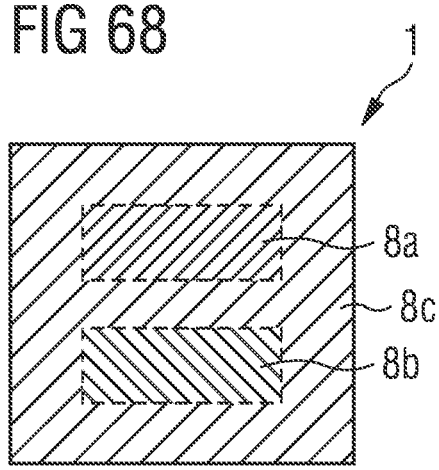
Figure 71:
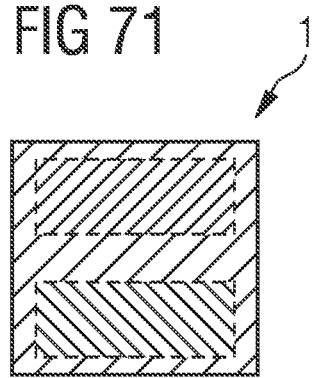
Figure 69:
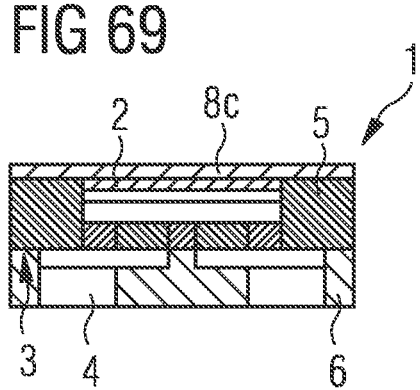
Figure 72:
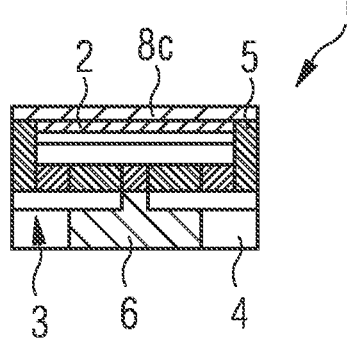
Figure 70:
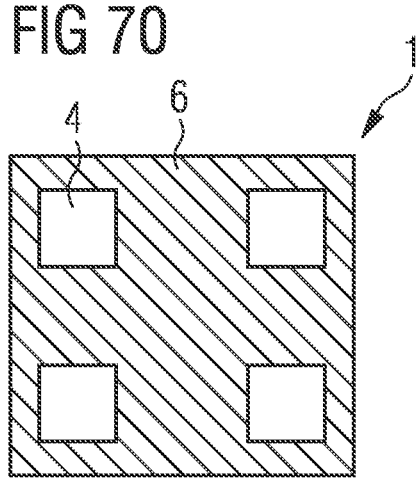
Figure 73:
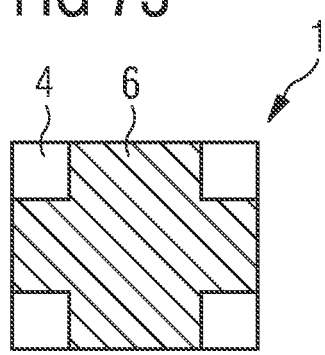
Figure 81:
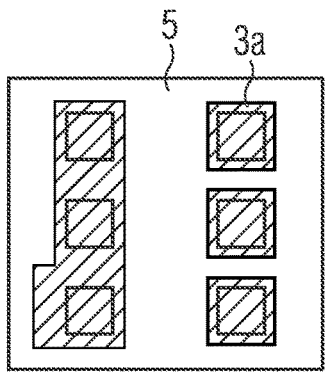
Figure 82:
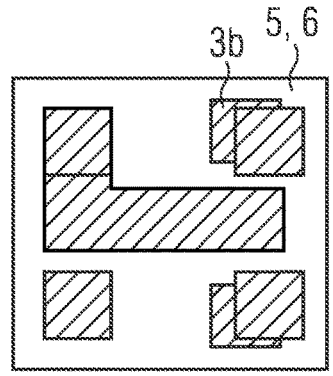

It can be seen from FIGS. 68, 69 and 70 that the diffuser layer 8c is optionally applied. According to FIG. 70, the four connection pads 4 are present in a square grid within the embedding body 6. In contrast, FIGS. 71, 72 and 73 illustrate that the connection pads 4 can also be located at corners of the embedding body 6.

In FIG. 74 it is illustrated that the phosphor layers 8a, 8b need not be limited to the semiconductor chips 2, but can also be applied to the base body 5 first and thus project laterally beyond the semiconductor chips 2.

A method for manufacturing largely corresponding to the preceding method for manufacturing is shown in connection with FIGS. 75 to 82. Here, three of the semiconductor chips 2 are provided with a phosphor 8r for generating red light, a phosphor 8g for generating green light, and a phosphor 8b for generating blue light, see FIGS. 75, 76 and 77.

Alternatively, there may be, for example, three of the semiconductor chips 2 which differ in their emission wavelengths and to which, in contrast to the illustrations of FIGS. 62 to 73, no phosphor is then assigned. In this case, the emission wavelengths can be red, green and blue in particular.

The embedding in the base body 5 as well as in the embedding body 6 is illustrated in FIGS. 78, 79 and 80.

Two fanning layers 3a, 3b can be used to electrically connect the semiconductor chips 2 to the total of four connection pads 4. These fanning layers 3a, 3b and the associated vias and connection pads are shown schematically in FIGS. 81 and 82.

Figure 83:
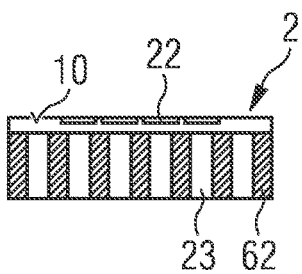
Figure 84:
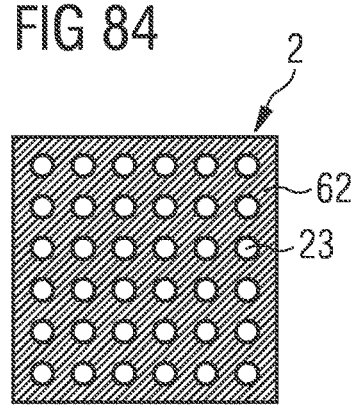
Figure 85:
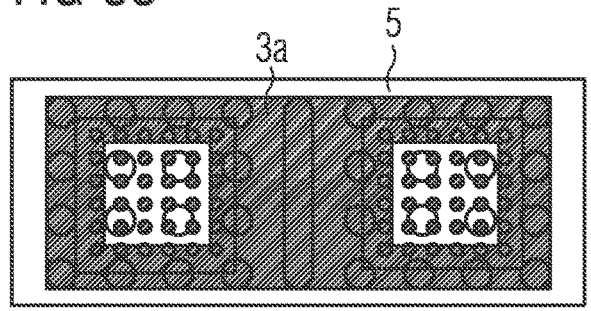
Figure 86:
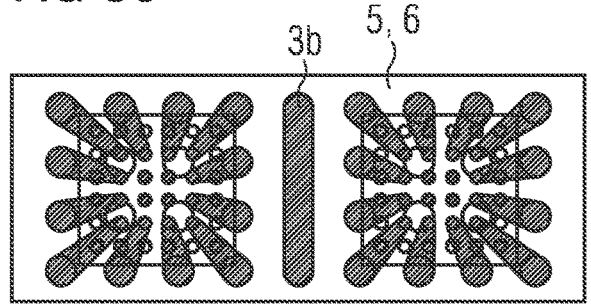
Figure 87:
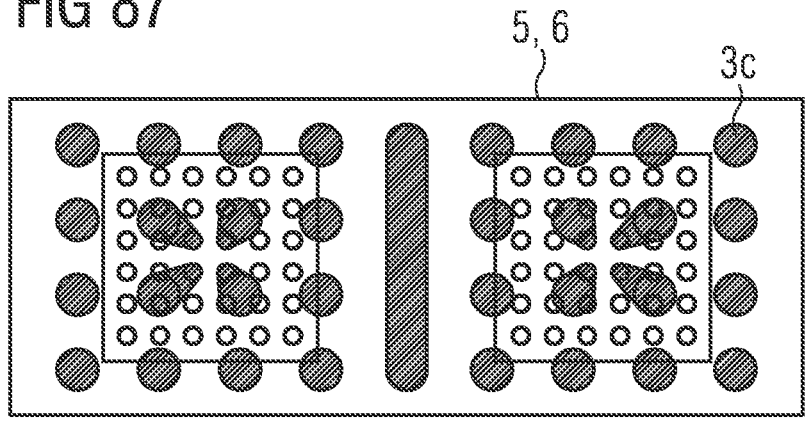
Figure 88:
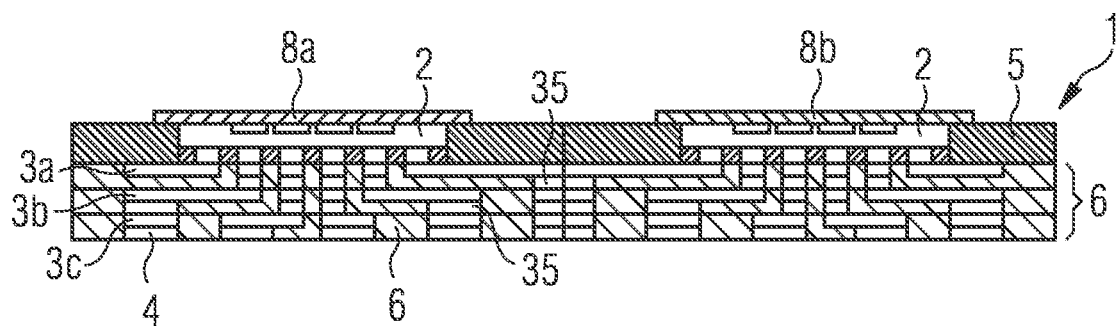
Figure 89:
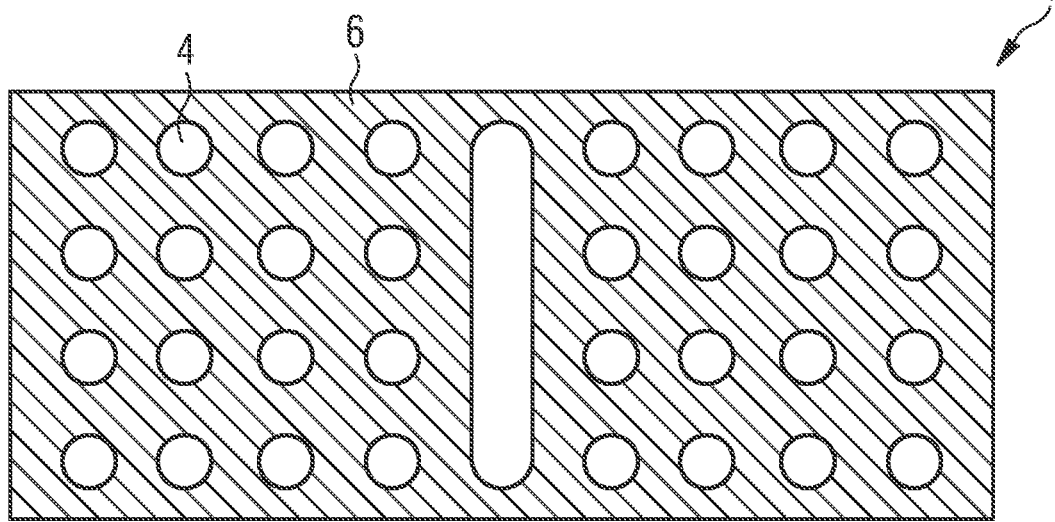

FIGS. 83 and 84 illustrates a semiconductor chip 2 with many pixels 22 in a narrow pitch. Accordingly, a plurality of fanning layers 3a, 3b, 3c are required to electrically interconnect two such semiconductor chips 2 to form a semiconductor device 1 as illustrated herein, see FIGS. 88 and 89. The associated fanning layers 3a, 3b, 3c are illustrated in FIGS. 85, 86 and 87. A phosphor layer 8a, 8b may be associated with each of the two semiconductor chips, see FIG. 88.

Figure 90:
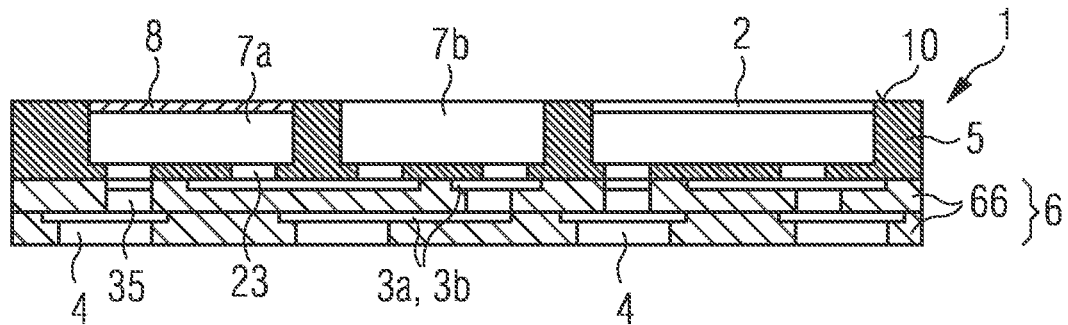
Figure 91:
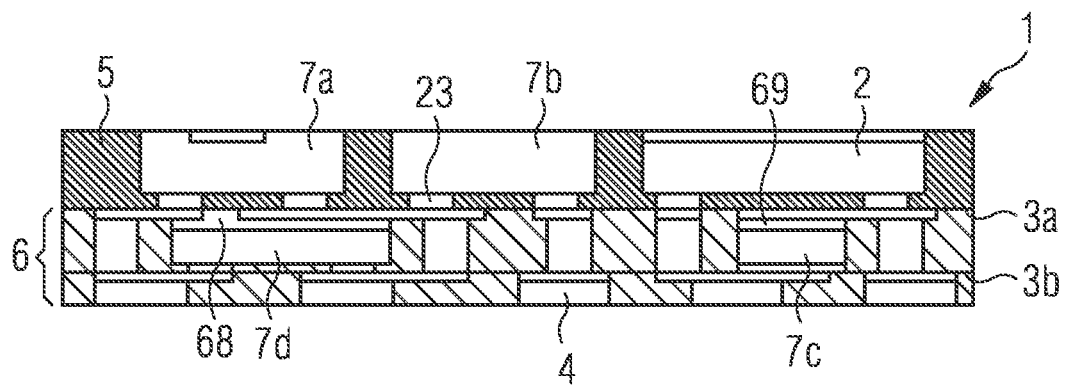
Figure 92:
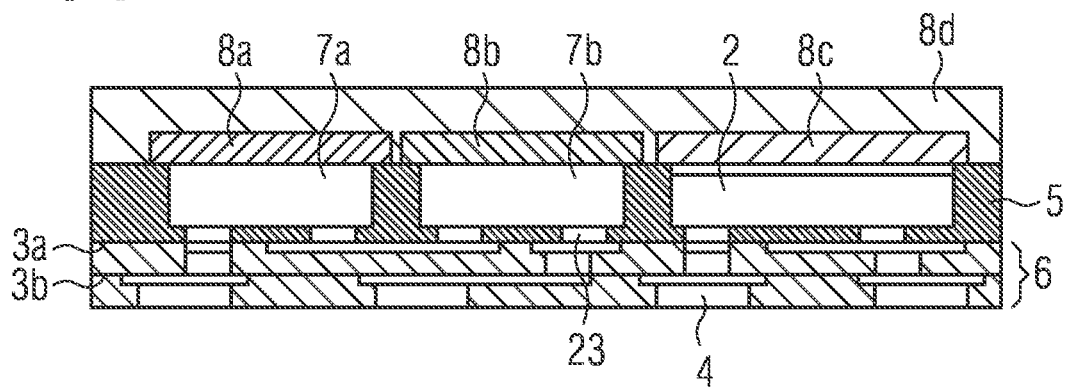
Figure 93:
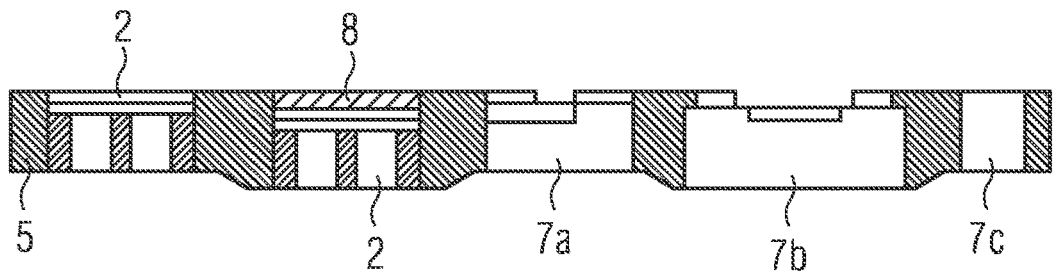

In the exemplary embodiments of FIGS. 90 to 92, the semiconductor devices 1 each comprise at least one additional chip 7. Via one or more fanning layers 3, the semiconductor chips 2 and the additional chips 7 are electrically connected to the connection pads 4. Furthermore, semiconductor chips and/or additional chips may be interconnected via one or more fanning layers, as illustrated.

Referring to FIG. 90, an IC chip 7a is provided. The additional chip 7a is optionally provided with a protective layer 8 on the light exit side 10 of the semiconductor device 1. The additional chip 7b is, for example, a photodiode.

In FIG. 91, it is illustrated that the additional chips 7 may be arranged in a plurality of planes. The additional chip 7a is, for example, an IC chip with an integrated sensor. The additional chip 7b, which is optional in this case, can again be a photodiode. The chip 7c is an ESD protection diode and the additional chip 7d can be a temperature sensor. For example, the ESD protection diode 7c may be attached via electrical bonding agents 69, such as a solder joint, a sintered joint, a conductive adhesive, or an electrically conductive adhesive film. The temperature sensor 7d, on the other hand, may be attached via a dielectric bonding agent 68, such as an adhesive connection or an electrically insulating adhesive foil.

In the example of FIG. 92, it is illustrated that various coatings 8 may be present. For example, a protective layer 8a, a filter layer 8b and a phosphor layer 8c may be associated with the chips 2, 7. Furthermore, a diffuser layer 8d covering everything is optionally present.

FIGS. 93 to 103 illustrate a further method for manufacturing. According to FIG. 93, the chips 2, 7a, 7b, 7c are embedded in the base body 5. The chips 2, 7a, 7b, 7c can comprise different thicknesses. The additional chip 7c is a chip for a via, also called a dummy chip. That is, the additional chip 7c serves only as an electrical via.

Figure 94:
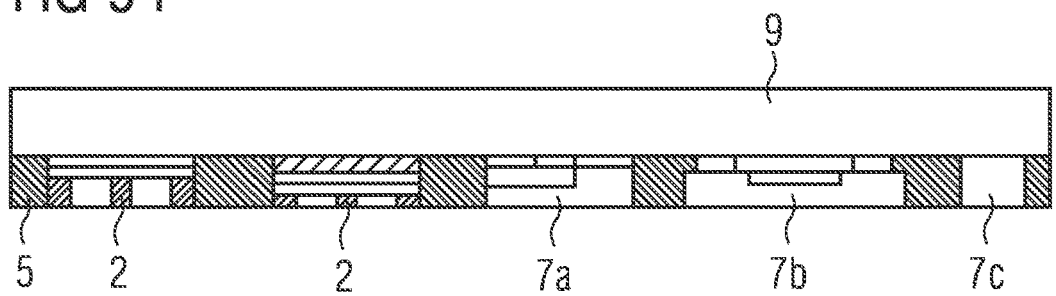

In the optional step of FIG. 94, the chips 2, 7a, 7b, 7c are planarized and thinned. This step is carried out, for example, on the auxiliary carrier 9.

Figure 95:
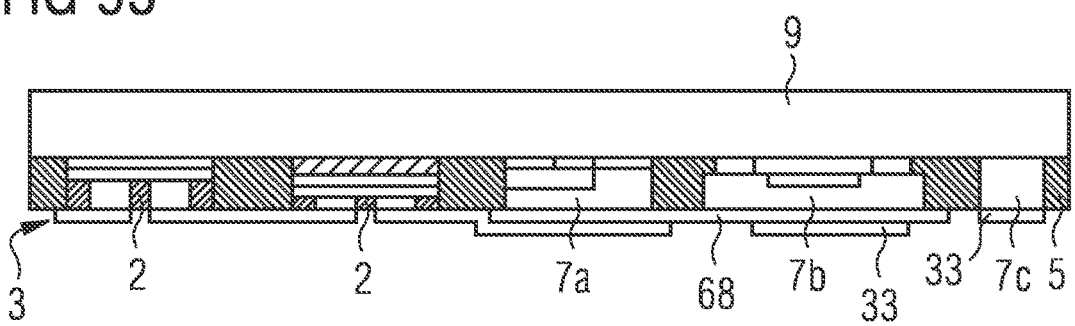

In FIG. 95 it is shown that a passivation 68 is applied to the chips 7a, 7b. Furthermore, the conductor tracks 33 for the fanning layer 3 are then created.

Figure 96:
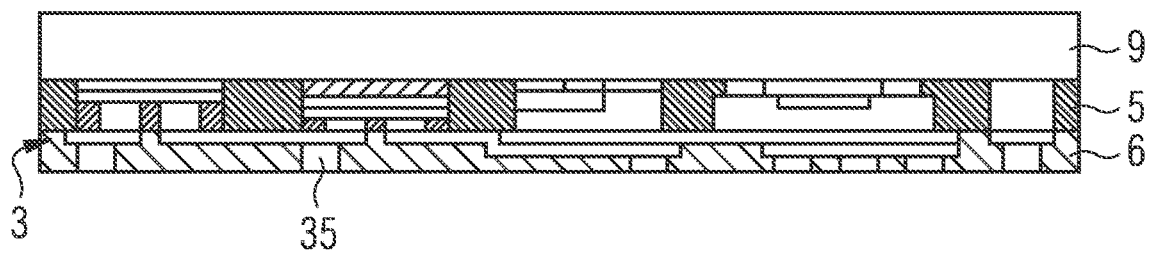

Thereupon, see FIG. 96, the embedding body 6 or at least a first partial layer of the embedding body 6 is created, preferably in combination with the vias 35.

Figure 97:
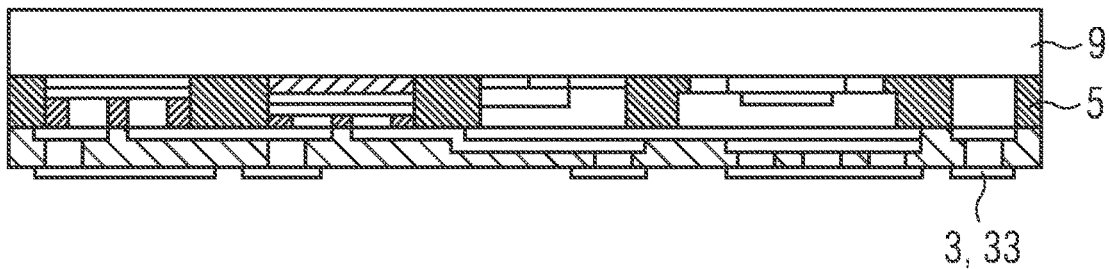
Figure 98:
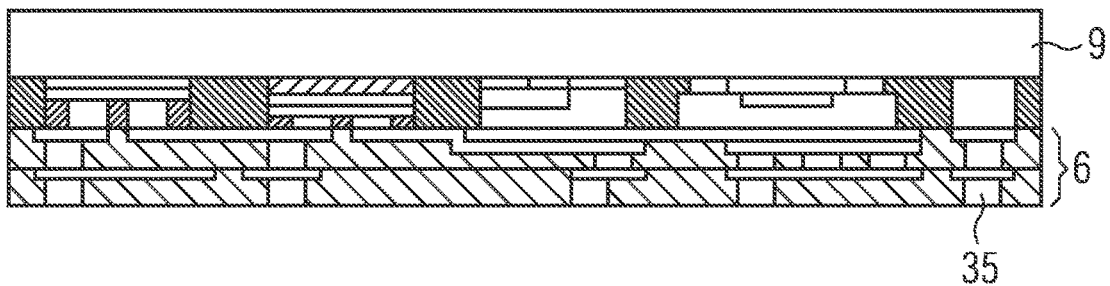

In the step shown in FIG. 97, a further fanning layer 3 with further conductor tracks 33 is produced. This further fanning layer 3 is provided with further vias 35 and surrounded by a further partial layer of the embedding body 6, see FIG. 98.

Figure 99:
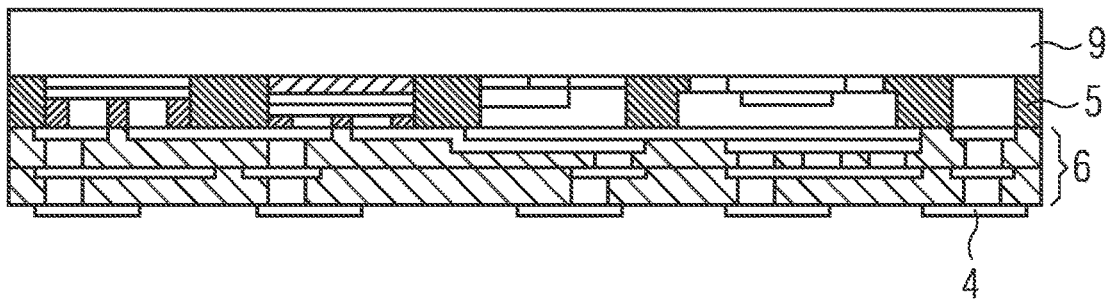

Finally, the connection pads 4 are created on the finished embedding body 6 at the vias 35 towards the fanning layers 3. This is illustrated in FIG. 99. In this way, the connection pads 4 can also project beyond the embedding body 6. This is possible in the same way in all other exemplary embodiments.

Figure 100:
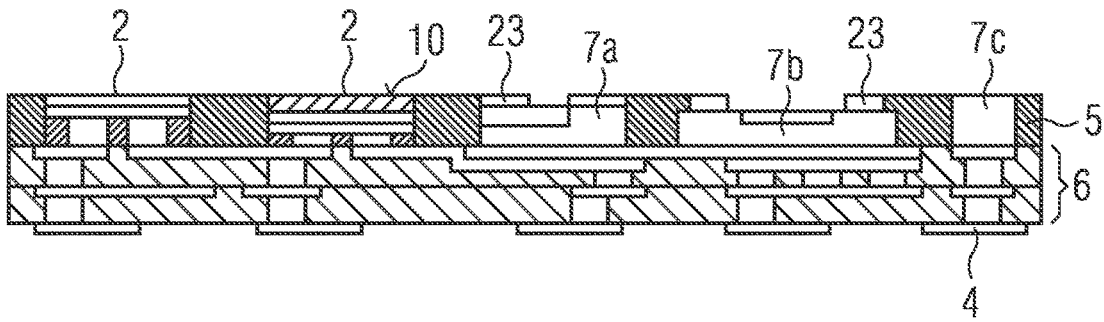
Figure 101:
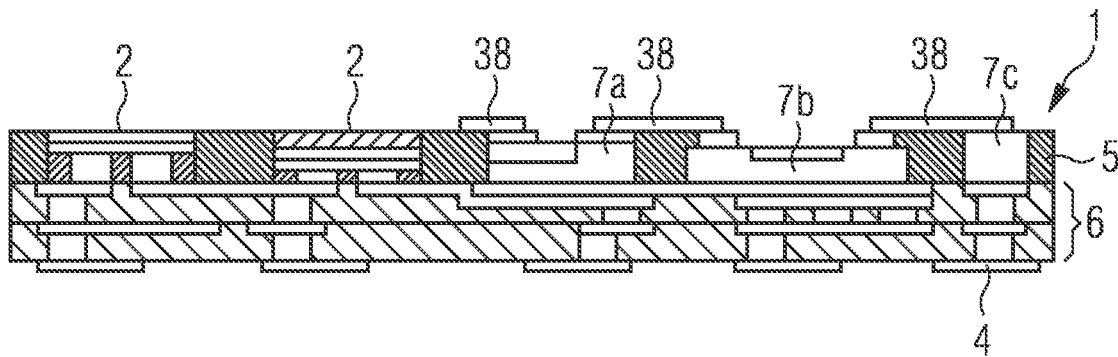

According to FIG. 100, the auxiliary carrier 9 is removed and planar electrical connection lines 38 are created on the side where the auxiliary carrier 9 was previously located, as illustrated in FIG. 101. The additional chips 7a, 7b, 7c can be electrically connected via the connection lines 38. In this method step, an optional additional auxiliary carrier, which is not shown, is provided at the connection pads 4.

In the optional step of FIG. 102, a plurality of coatings 8 are applied. For example, a phosphor layer 8c, a diffuser layer 8d, a transparent protective layer 8e, a filter layer 8b and an opaque cover layer 8a are provided. These layers may partially or completely cover each other, if necessary.

Such coatings 8a, 8b, 8c, 8d, 8e can accordingly also be used in all exemplary embodiments.

In the optional step of FIG. 103, the contact balls 39 are produced.

FIGS. 104 to 106 show method steps that can be carried out alternatively to the method steps of FIGS. 93 to 97. For example, it is shown in FIGS. 104 and 105 that an auxiliary carrier is not necessarily used.

This means that the chips 2, 7a, 7b can comprise different thicknesses even after the fanning layer 3 has been applied, see FIG. 105. Thus, the fanning layer 3 can also comprise a corrugated course. The fanning layer 3 therefore does not necessarily have to lie in one plane.

In FIG. 106, the vias 35 and the embedding body 6 or at least a partial layer of the embedding body 6 are produced. Planarization can be achieved via the production of the embedding body 6 and via the production of the vias 35. FIG. 106 is preferably followed by method steps corresponding to FIGS. 98 to 103.

FIGS. 107 to 114 concern a further example of a method for manufacturing. The configuration of FIG. 107 corresponds to the arrangement of FIG. 97, whereby the auxiliary carrier need not be present.

Figure 108:
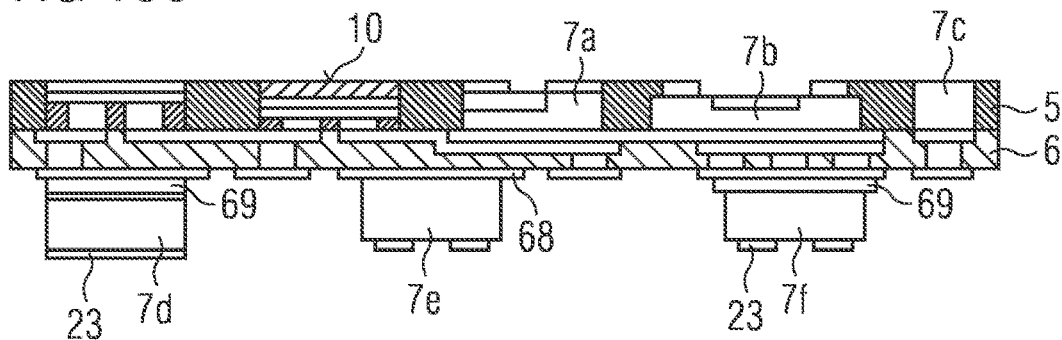

FIG. 108 illustrates that in addition to the auxiliary chips 7a, 7b, 7c, the auxiliary chips 7d, 7e, 7f are attached. The additional chips 7d, 7e, 7f are located in a second plane which is further away from the light exit side 10. The auxiliary chips 7d, 7e, 7f are, for example, memory chips, address chips and/or interfaces for a data input and a data output.

The additional chips 7d, 7e, 7f are attached, for example, via bonding agents 68, 69. The bonding agent 69 is electrically conductive and is, for example, a solder joint, a sintered joint, a conductive adhesive or an electrically conductive adhesive film, whereas bonding agent 68 is electrically non-conductive and is, for example, an adhesive joint or an electrically insulating adhesive film. Contact pads 23 of the additional chips 7d, 7e, 7f preferably face away from the light exit side 10.

In the following, the dummy chips 7g designed as vias are preferably mounted, see FIG. 109.

Figure 109:
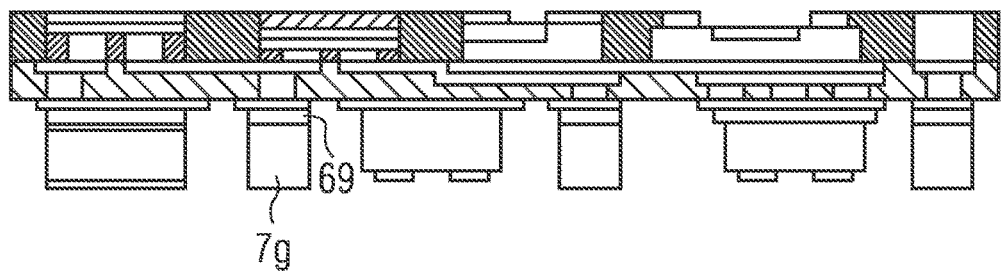
Figure 110:
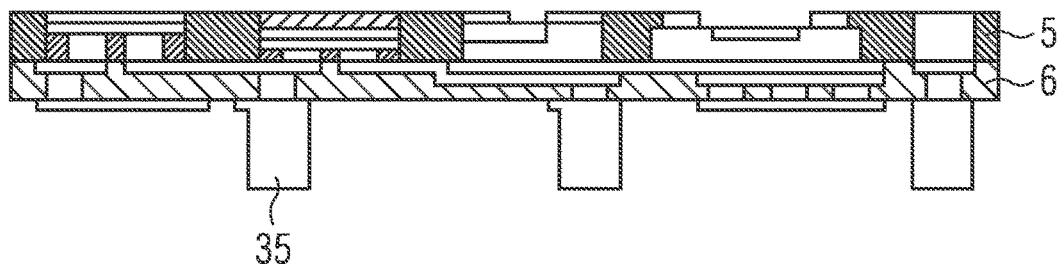

As an alternative to the dummy chips 7g, thicker vias 35 can also be produced, see FIG. 110. The production of the vias 35 or the mounting of the dummy chips 7g can also be interchanged with regard to the mounting of the additional chips 7d, 7e, 7f, see the downstream method step of FIG. 111. The steps of FIGS. 110 and 111 thus represent alternatives to the steps of FIGS. 108 and 109, also with regard to the sequence of these method steps.

Figure 111:
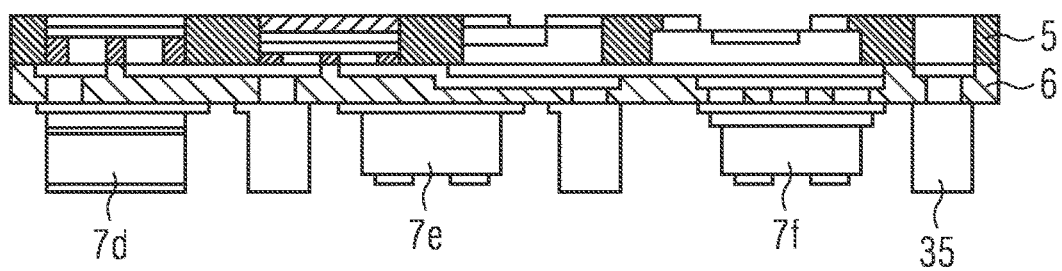
Figure 112:
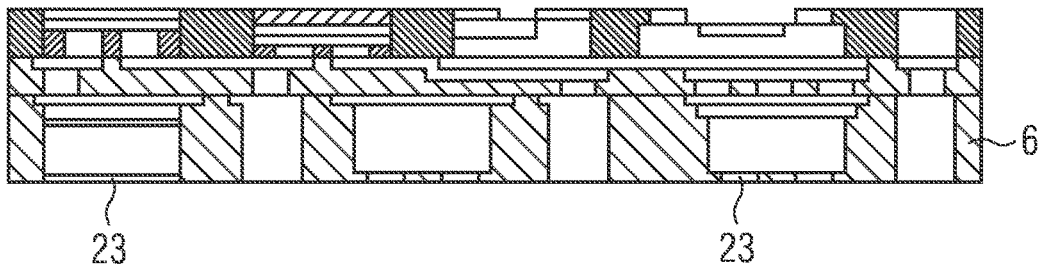

Building on the arrangement of FIG. 111, or alternatively building on the arrangement of FIG. 109, the embedding body 6 is created. This is illustrated in FIG. 112.

Figure 113:
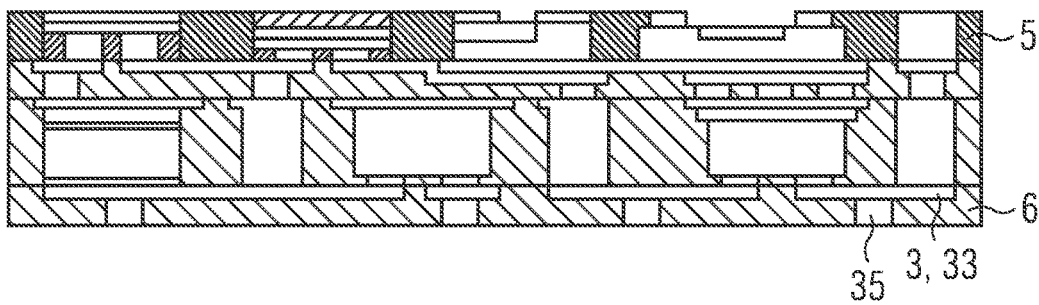

Thereupon, a further fanning layer 3 is created, on which the further vias 35 are created. This further fanning layer 3 is in turn surrounded by a partial layer of the embedding body 6. This is shown in FIG. 113.

Figure 114:
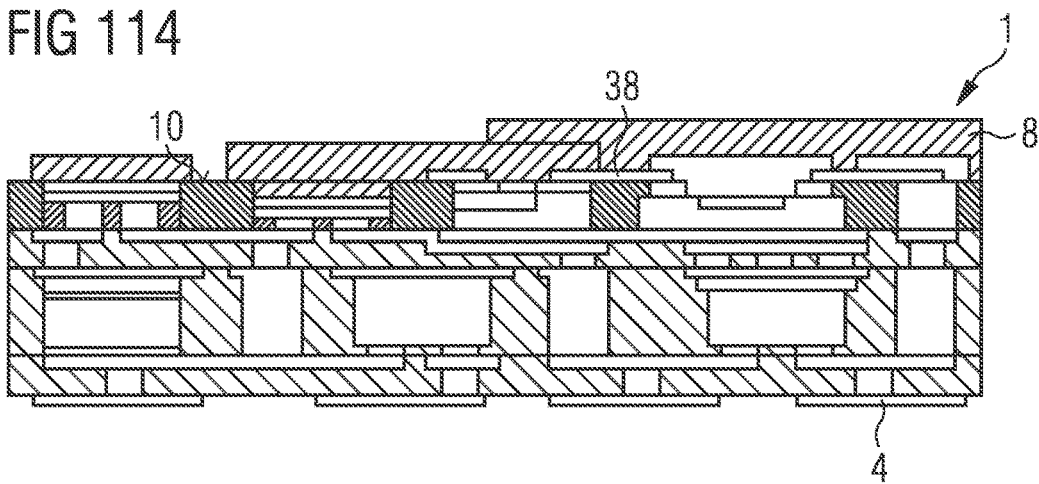

In the optional step of FIG. 114, the coatings 8 can be created analogously to FIG. 102 and, analogously to the step of FIG. 101, the interconnect lines 38 can be created on the light exit side 10.

FIGS. 115 to 119 illustrate an alternative process flow for creating vias, connection pads and/or embedding bodies.

Figure 115:
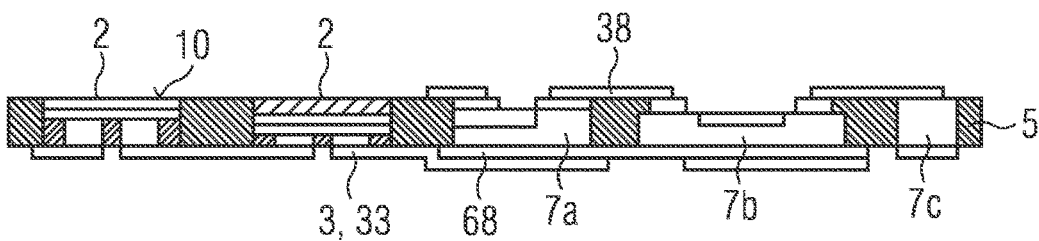

For example, the arrangement of FIG. 115 builds on the arrangement of FIG. 95. Here, however, there is no auxiliary carrier on the light exit side 10, so that the connection lines 38 can be created directly.

Figure 116:
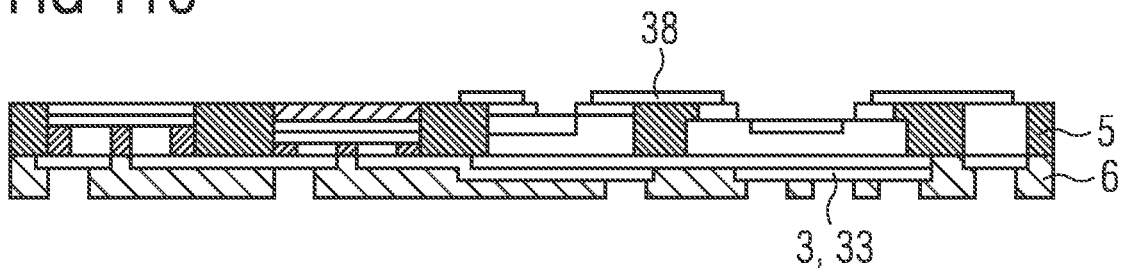
Figure 117:
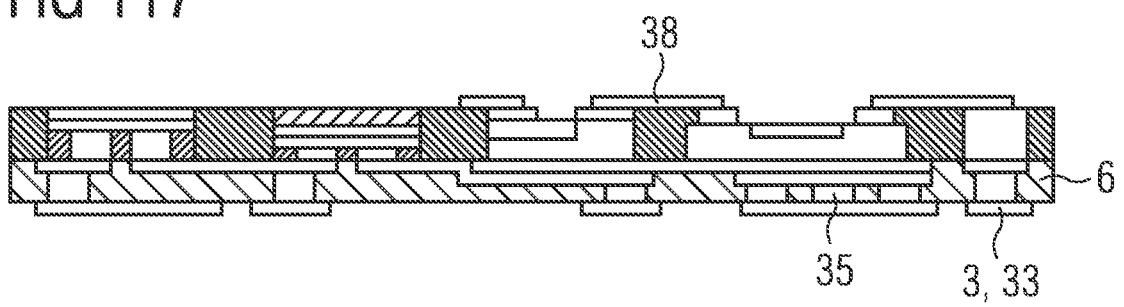

Subsequently, see FIG. 116, the embedding body 6 or a partial layer of the embedding body 6 is preferably applied in a structured manner so that openings remain on the conductor tracks 33. These openings are subsequently filled with a material for the vias 35 and a further fanning layer 3 is created. This is illustrated in FIG. 117.

Figure 118:
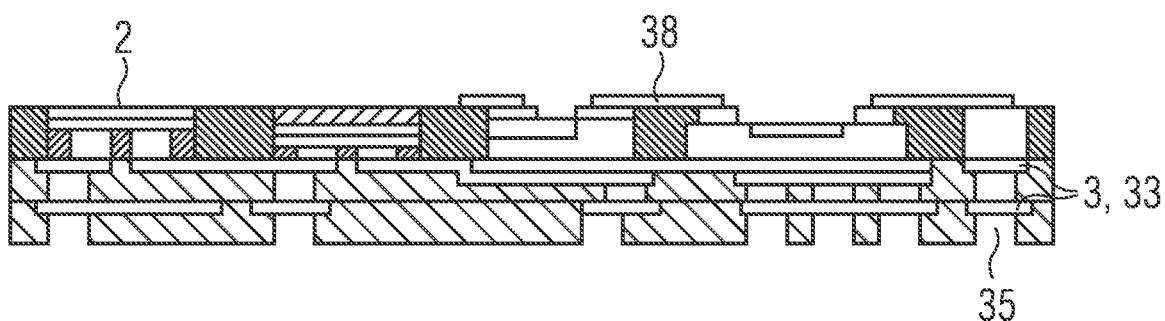

The creation of a further fanning layer 3 with the associated vias 35 and the planarization and embedding via a further partial layer of the embedding body 6 can be seen in FIG. 118.

Figure 119:
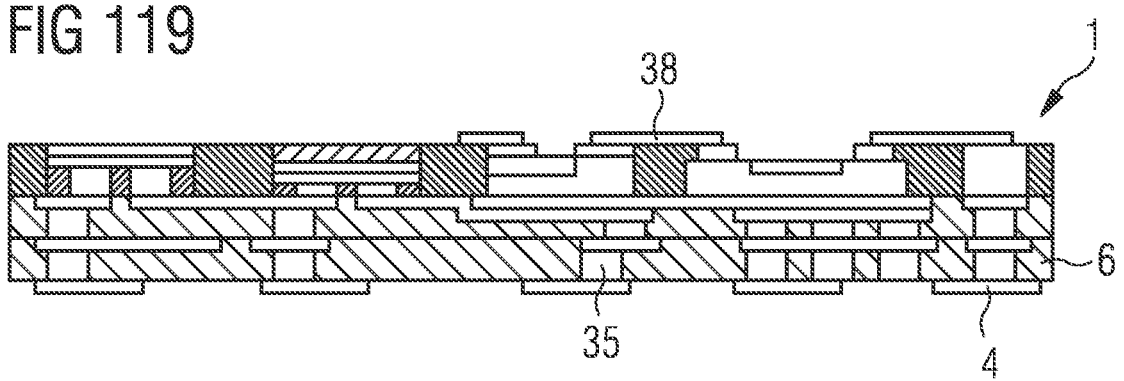

The connection pads 4 are then applied to these vias 35 and to the finished embedding body 6, see FIG. 119.

FIGS. 120 to 123 illustrate an alternative process flow for the production of vias and/or embedding bodies. This method is particularly suitable for different chip heights of the chips in inner layers.

Figure 120:
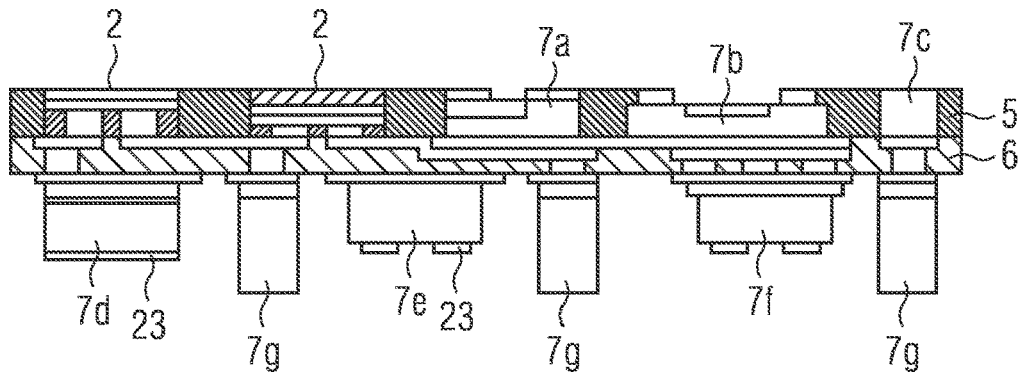

The configuration of FIG. 120 builds on the arrangement of FIG. 117. Analogous to the method of FIGS. 107 to 114, a further layer of the additional chips 7d, 7e, 7f can be attached. Optionally, the dummy chips 7g are present as vias or, alternatively, thicker vias specifically in the form of metallizations.

Figure 121:
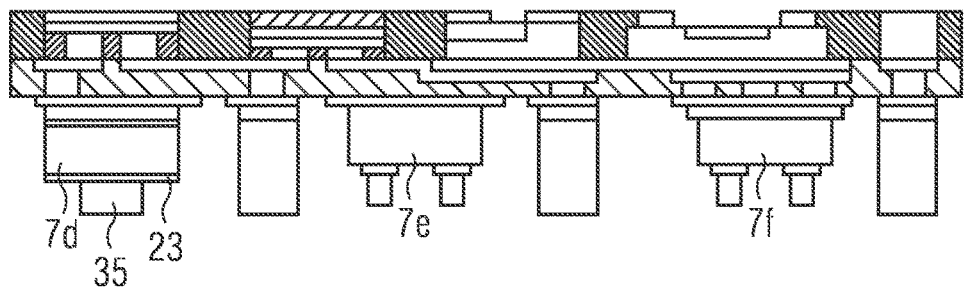

Optionally, vias 35 or thicker electrical contact surfaces are applied to the additional chips 7d, 7e, 7f via their contact pads 23, see FIG. 121.

FIG. 122 illustrates that the material for the embedding body 6 is completely applied. In this process, the embedding body 6 covers the previously created vias 35 as well as the additional chips 7g designed as vias.

In the step of FIG. 123, the embedding body 6 is thinned so that the vias 35 and the dummy chips 7g are exposed. Further processing is preferably carried out in the same way as in FIGS. 99 to 103.

Such initial thicker application of material for the embedding body 6 and subsequent thinning of the embedding body 6 can also be used accordingly in all other exemplary embodiments of the method for manufacturing.

FIGS. 126 to 157 relate to exemplary embodiments of the semiconductor devices 1, particularly for video walls.

In video walls many individual RBG LED devices, i.e., LED devices each having at least one red-emitting LED chip, one blue-emitting LED chip, and one green-emitting LED chip, are usually assembled to form the video wall. This is illustrated in FIGS. 124 and 125. Each of the RBG LED components represents a pixel 11.

The size of the pixel 11 is limited by, among other things, the size of the RBG LED components, that is, a pixel 11 cannot become arbitrarily small. In order for a viewer to see the individual color dots or pixels combine to form an image, a certain distance of the viewer from the video wall is necessary. This distance depends on the size of the pixels 11. For some video walls with an intended observer distance of about 1 m, for example advertising in bus stops, a size of the pixels 11 is necessary that can no longer be achieved by individual RBG LED components.

The term "Narrow Pixel Pitch", or NPP for short, refers to the concept of integrating many units of red, green and blue emitting LED chips for the pixels 11 in one large module, so that a customer no longer has to assemble many individual RGB LED components but a much smaller number of such modules to form a video wall. This also allows the LED chips to be packed more tightly, reducing the size of the pixels 11 and thus the necessary distance of the observer accordingly.

In the case of the semiconductor devices 1 described here, it is possible to arrange the individual semiconductor chips 2 close together, to make efficient electrical contact and to create modules with many pixels 11. Flip chips are preferably used for this purpose.

In addition to the chip size itself, a limiting factor for small pixels with small chip pitches is primarily the wiring of the chips in the substrate or carrier, i.e. how finely can the wiring structures be produced and how can they be stacked and what do the necessary vias, also known as interconnects or vias, look like. In particular, for common substrates such as printed circuit boards, the smallest possible via is limited by the via diameter and the tolerances of the viacap. These limitations can be overcome in the semiconductor devices 1 described here.

Figure 126:
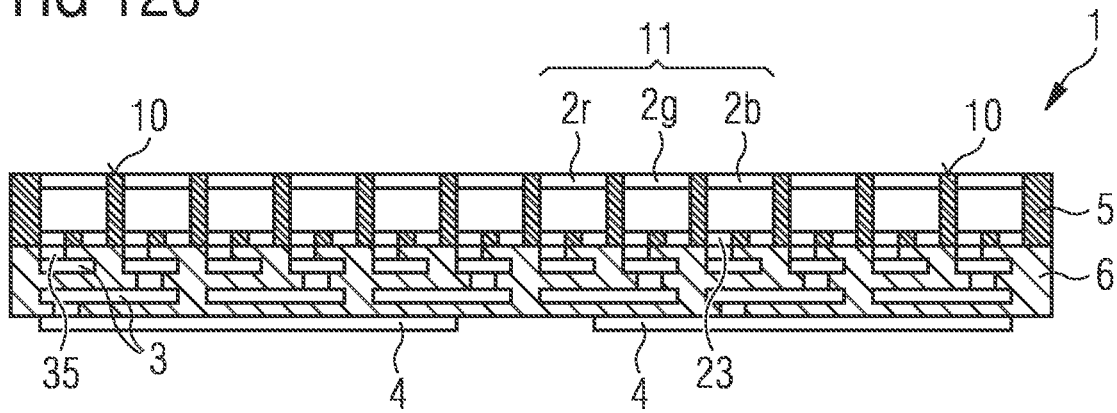

In the exemplary embodiment of FIG. 126, the pixels 11 are formed respectively by a red-emitting semiconductor chip 2r, by a green-emitting semiconductor chip 2g and by a blue-emitting semiconductor chip 2b. Phosphors are not required. The semiconductor chips 2b, 2r, 2g are flip chips. The semiconductor chips 2b, 2r, 2g may each be volume emitters with a light-transmissive substrate or surface emitters.

For example, the individual semiconductor chips 2b, 2r, 2g comprise edge lengths between 20 µm and 100 µm, inclusive, when viewed from above the light exit side 10. A chip edge-to-chip edge distance between adjacent semiconductor chips 2b, 2r, 2g is preferably at least 10 µm and/or at most 100 µm, for example around 25 µm. All semiconductor chips 2b, 2r, 2g may be arranged with the same pitch in the semiconductor device 1. The arrangement and number of electrical connection pads 4 is illustrated only schematically in FIG. 126.

Figure 127:
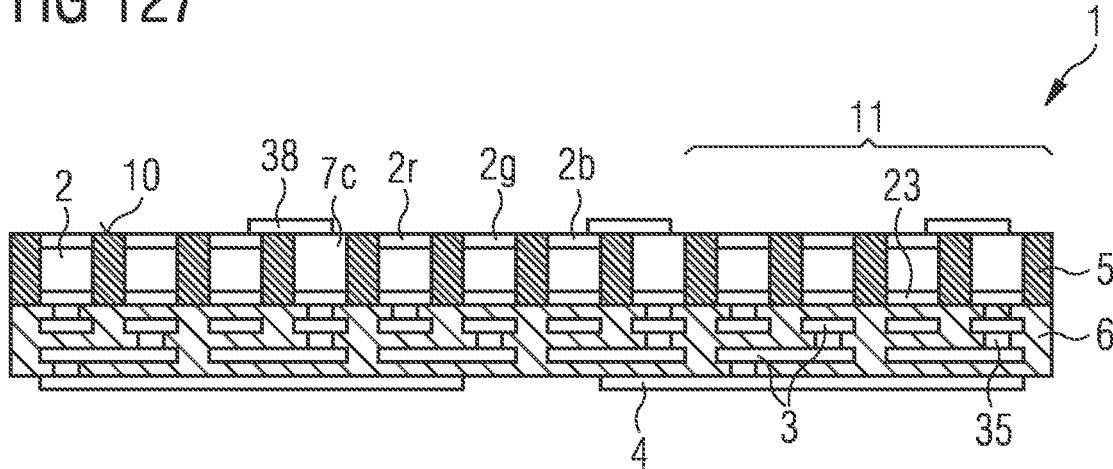

In FIG. 127 it is shown that instead of flip chips, chips with electrical contact pads on opposite main sides can be used for the semiconductor chips 2. Accordingly, the through-plating chips 7c as well as the planar interconnect lines 38 are present.

In all other respects, the explanations for FIG. 126 apply accordingly to FIG. 127.

Figure 128:
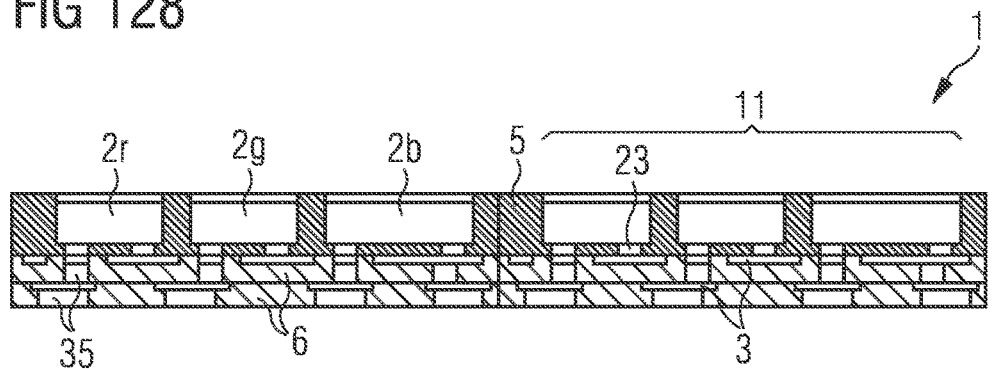

In the exemplary embodiment of FIG. 128, it is illustrated that the vias 35, which are exposed on the potting body 6, can simultaneously serve as electrical connection pads 4. In contrast, in FIG. 129, additional coatings are provided for the connection pads 4, with these coatings extending to the potting body 6.

Figure 129:
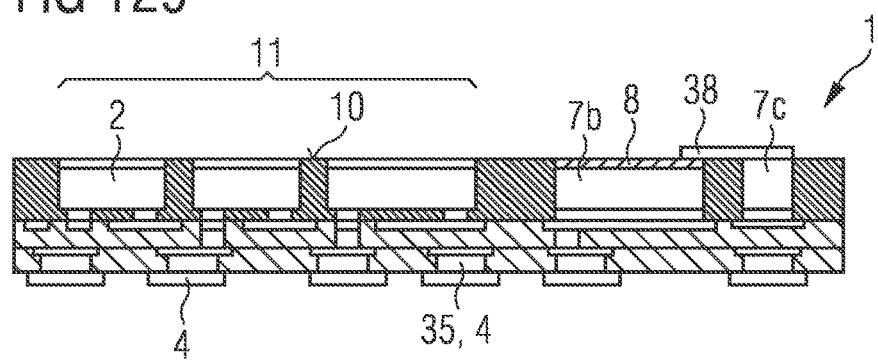

Furthermore, it is shown in FIG. 129 that an ambient light sensor, for example, can be present as an additional chip 7b. The additional chip 7b is provided with the optical coating 8, for example. It is possible that the additional chip 7b is electrically connected via the planar connection line 38 and a dummy chip 7c.

Figure 130:
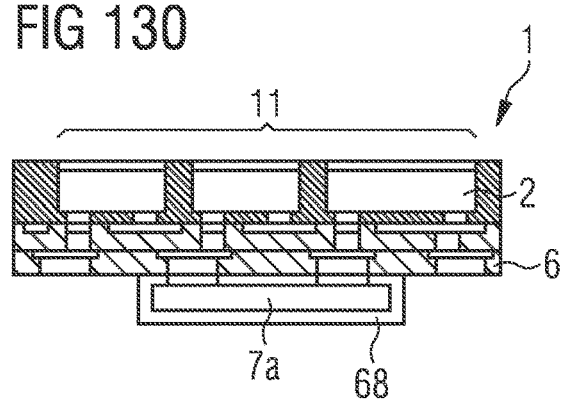
Figure 131:
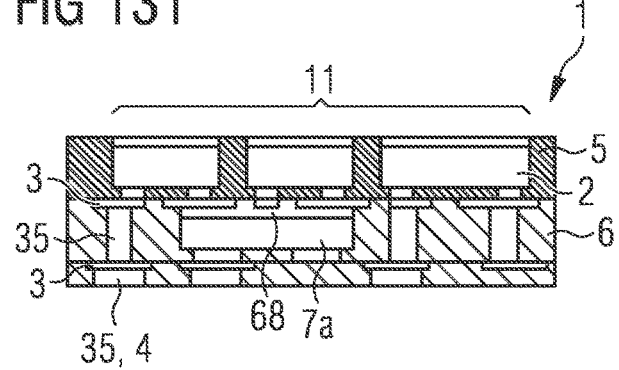

In the exemplary embodiments of FIGS. 130 and 131, a driver circuit is provided as the additional chip 7a in each case. The driver circuit 7a may be attached to the potting body 6 and is optionally provided with the passivation 68, see FIG. 130. Alternatively, the driver circuit 7a may also be integrated in the potting body 6, see FIG. 131.

The semiconductor devices 1 described here can be used to produce narrow pixel pitch modules, for example for video walls, whose pixel sizes and pixel pitches are smaller than with previous technologies. Compared to classical substrate-based packages, no substrate is used and a reduction in the number of sequential methods for manufacturing in favor of batch processes can thus be achieved. This is a more cost-effective approach especially when using many small LED chips, which is the common configuration for narrow pixel pitch devices.

Multiple fan out layers, i.e. fanning layers 3, can also be used to realize more complex interconnections. For example, a matrix interconnect is given with one layer for interconnecting the cathodes, one layer for interconnecting the anodes, and one layer for a favorable interconnect to the solder pads. There is no principal limit to the number of fan out layers that can be used.

The design of the semiconductor device 1 described here does not involve any intrinsic thermal drawbacks, it can be adapted to the thermal requirements by the thickness of the fan out layer as well as the choice of metals, in particular Ni or Cu.

A semiconductor device 1 can be efficiently manufactured, for example as a module, which in addition to the LED chips also contains and interconnects other chips or components such as sensor chips, IC chips, components with an optical function or optically inactive chips. This makes it possible to offer a significantly expanded range of functions.

In particular, for example, LED current drivers and RBG actuators can be integrated to achieve a higher degree of integration and to reduce the number of module pads, i.e. the number of connections 4. Reflection light barrier ICs as well as ESD protection diodes can be integrated as well. In particular, an integrated optoelectronic system can be implemented in one component. The optically inactive chips or elements are, for example, also current limiters or temperature limiters, integrated circuits with driver function, evaluation function, memory function or interface function, classic passive components such as resistors, capacitors or inductors, non-optical sensors such as temperature sensors, position sensors, Hall sensors, pressure sensors or sound sensors, and also in particular dummy chips, for example made of metal or a correspondingly highly doped semiconductor, as vias.

In the semiconductor device 1 of FIG. 132, several stacked fanning layers 3 are present. As in FIG. 128, the final vias 35 are designed as connection areas 4. In contrast, in FIG. 133 there is a dedicated solder contact layer for the connection pads 4.

In particular, a patterned dielectric layer may be provided below each fanning layer 3. This is particularly useful when the chips 2, 7 are integrated in further layers, as shown for example in FIG. 108 or 120.

As in all other exemplary embodiments, the fanning layers 3 and/or the vias 35 may be made of copper and/or nickel and/or aluminum. In particular, layers may be used between the contact pads 23 and the fanning layers 3 and the vias 35 to improve electrical contact, to improve thermal contact, to improve reliability and/or to suppress diffusion. In particular, such layers are made of titanium and/or platinum and/or palladium and/or tungsten nitride or alloys or layers thereof. Also, the contact pads 23 and the connection pads 4 may be made of titanium and/or platinum and/or palladium and/or tungsten nitride and/or gold and/or tin and/or silver and/or copper and/or aluminum or alloys or layers thereof.

It is possible that the chip top side of individual optically active chips or also the module top side, i.e. the light exit side 10, is roughened. In particular, the semiconductor device 1 designed as a chip sized package may include additional electrically non-conductive layers on the upper side. These may be arranged on top of each other, next to each other, overlapping or in a combination thereof. Such layers are for example made of at least one silicone, epoxy, glass and/or polysiloxane, where light converter materials, fillers, diffusers, filters, absorbers, reflectors, dyes or mixtures thereof may be enriched. This is illustrated in particular in FIG. 134.

The semiconductor devices 1, which are in particular narrow pixel pitch modules, typically comprise an area of a few centimeters by a few centimeters. They should therefore comprise a thickness which sufficiently mechanically stabilizes the semiconductor device 1 in the target size. Such semiconductor devices 1 can be manufactured to be very thin.

To simplify the illustration, the semiconductor devices 1 of FIGS. 129 to 134 each comprise only one pixel 11. Preferably, however, a plurality of the pixels 11 are present.

FIGS. 135 to 152 are plan views, that is, views which are looking at the light exit side 10 of a semiconductor device 1.

FIGS. 135 to 143 illustrate semiconductor devices 1 with different arrangement and geometry of pixels 11, partly with additional chips 7. A display is composed of one or more semiconductor devices 1. The arrangement of the pixels in the component and in the display is usually in a regular grid.

FIGS. 144 to 152 each show the assembly of a pixel 11 from semiconductor chips 2, in some cases with additional chips 7.

According to FIG. 135, there is no dedicated edge area around the semiconductor chips 2. This means that several of the semiconductor devices 1 can be placed next to each other in such a way that all pixels 11 are arranged in the same pitch.

In the example shown in FIG. 136, the semiconductor device 1 comprises an edge of the base body 5 on one side. In FIG. 137, such an edge is present on all sides.

In FIG. 138, an array with a plurality of pixels 11 is shown. An edge of the semiconductor device 1 around the pixels 11 may be very narrow or may be omitted altogether so that the pixels 11 can be arranged with the same pitch across components. The same applies to all other exemplary embodiments.

According to FIG. 139, the semiconductor device 1 is designed as a divided pixel array. Between the two partial fields there is an area of the base body 5 which is free of chips.

According to FIG. 140, the pixel array comprises a defect area which is free of one of the pixels 11. Optionally, an electrical via or an additional chip can be attached to such a defect. This is illustrated in FIG. 141, wherein, in addition, an edge of the base body 5 may be provided with additional chips 7. The additional chips 7 are preferably present at the module level, but not at the pixel level. That is, the additional chips 7 are not necessarily associated with individual pixels 11.

FIG. 142 illustrates that the pixels 11 do not necessarily have to be in a square or rectangular grid, but can also be in a hexagonal or trigonal grid, for example. In this case, the pixels 11 may also be triangular in shape, as seen in plan view, although other basic shapes such as hexagonal pixels, as seen in plan view, are also possible.

Figure 144:
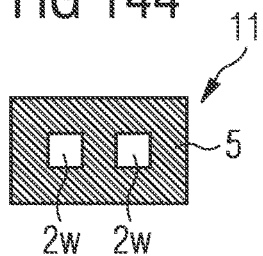

FIG. 144 illustrates an example in which a pixel 11 cannot represent the color range visible to humans almost completely by red/green/blue color mixing, as is usual for video walls, but only a significantly reduced partial range thereof. For example, a pixel 11 contains two converted chips 2$w$ that emit white light of different color temperatures, suitable, for example, for a video wall that can only display brightnesses but not colors, but can adapt to the ambient light in terms of color temperature.

Figure 145:
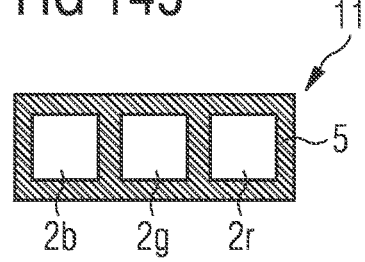
Figure 146:
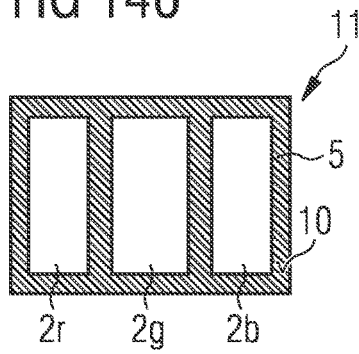
Figure 147:
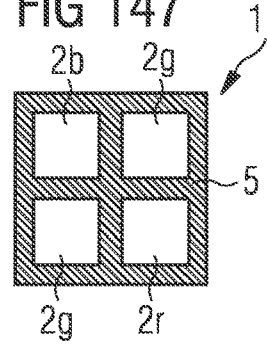

FIGS. 145 to 147 illustrate further configurations of pixels 11, for example in video walls.

The pixel 11 in FIG. 145 has a rectangular elongated shape and contains three, for example square, semiconductor chips 2$r$, 2$g$ and 2$g$ in the emission colors red, green and blue. In contrast, the pixel 11 of FIG. 146 is rectangular in plan view and contains three rectangular elongated semiconductor chips 2r, 2g, 2b in the emission colors red, green and blue. The pixel 11 in FIG. 147 is square and also contains square semiconductor chips 2r, 2g, 2b, in particular four of them, for example in the emission colors red, twice green and blue. Depending on the chip technology, rectangular elongated semiconductor chips or semiconductor chips with a different design in plan view may also be advantageous.

Figure 148:
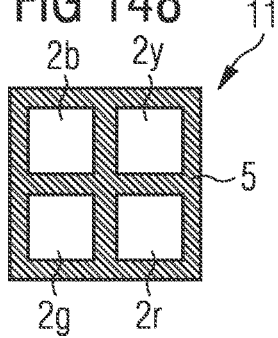

Instead of two semiconductor chips emitting the same color, a semiconductor chip with a fourth emission color can also be used, see for example the yellow-emitting semiconductor chip 2y in FIG. 148. Alternatively or in addition to a yellow-emitting semiconductor chip, a cyan-emitting semiconductor chip can also be present.

Figure 149:
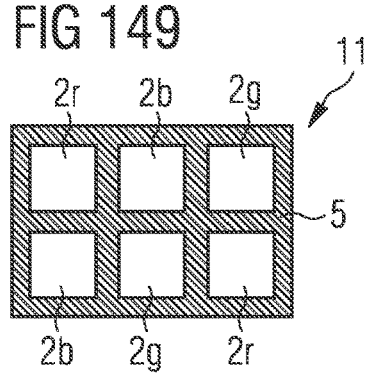

In the rectangular elongated pixel 11 of FIG. 149, six, for example, square semiconductor chips are present. For example, the emission colors red, green and blue can each be represented twice. Here, too, an additional emission color can be used instead of two semiconductor chips emitting the same color.

Figure 150:
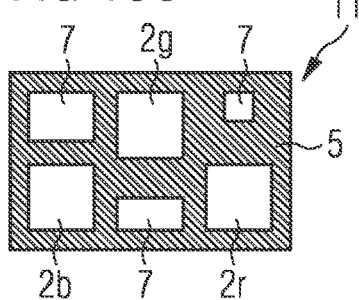

FIG. 150 illustrates that a pixel 11 may contain one or more additional chips 7 in addition to the semiconductor chips 2r, 2g, 2b. The additional chips 7 are, for example, three photosensors with different color filters to detect ambient light and emission light of the pixel 11 in brightness and color and to control the pixel 11 with this information. Thus, the additional chips 7 can be integrated at the component level, at the pixel level, or at both levels.

Figure 151:
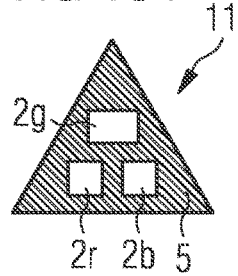

FIGS. 151 and 152 show exemplary embodiments of pixels 11 that are neither square nor rectangular when viewed from above, but for example triangular or hexagonal, optionally with or without auxiliary chips. Such pixels can be used to create trigonal or hexagonal pixel grids in the semiconductor device 1.

FIG. 153 shows a driving of an exemplary embodiment of a semiconductor device 1. A data input stream 13a of the pixels to be displayed reaches a computing unit 12, which generates a data output stream 13b to the semiconductor device 1 designed as a display. The computing unit 12 can be designed as a separate component or can also be integrated in the semiconductor device 1.

With such an arrangement, for example, so-called downsampling can be realized: Here, the number of pixels to be displayed is greater than the displayable number of pixels of the display. The number of pixels to be displayed is greater than the number of pixels that can be displayed on the display. For example, 1920×1080 pixels are downscaled to 1280×720 pixels.

The computing unit 12 can be designed as a separate component or can also be integrated in the semiconductor device 1.

For a regular arrangement not only of all pixels 11, but of all semiconductor chips 2 in the complete display, optionally together with a control according to FIG. 153, a special and particularly effective form of downsampling can be realized. In this case, the pixels are assigned to the raster of semiconductor chips in an overlapping manner rather than in the classical way next to each other. The downsampling rate is fixed by the design of the display, which means that a simpler computing unit is sufficient.

In this way, the number of pixels that can be displayed can be significantly increased with a given or limited number of semiconductor chips while maintaining the image sharpness and/or the number of semiconductor chips required for this can be significantly reduced for a given number of pixels to be displayed, for example 1920×1080.

Figure 154:
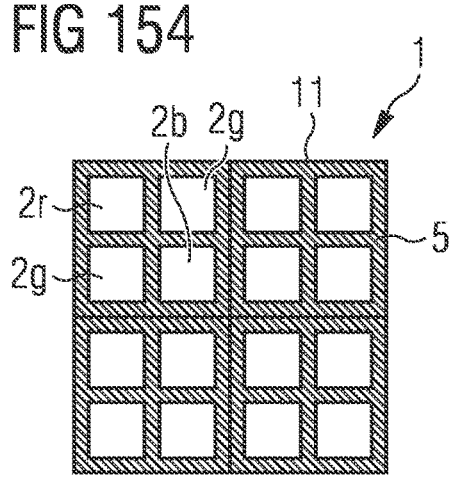
Figure 155:
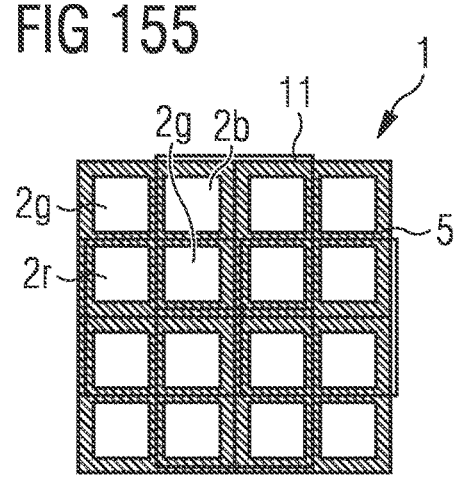
Figure 156:
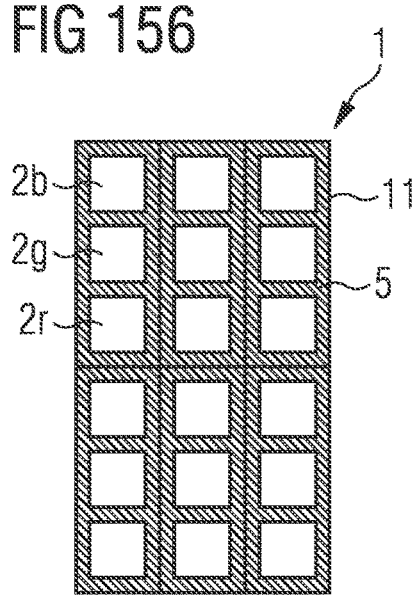
Figure 157:
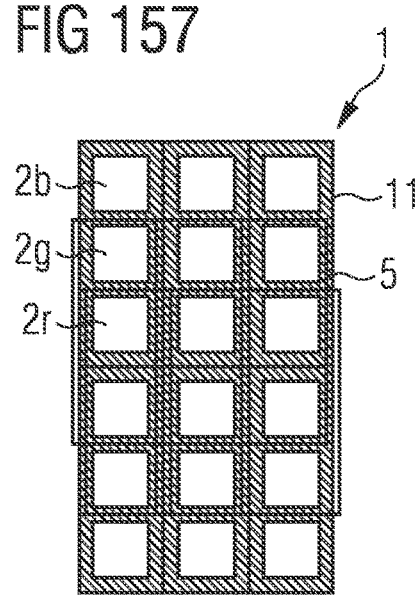
Figure 158:
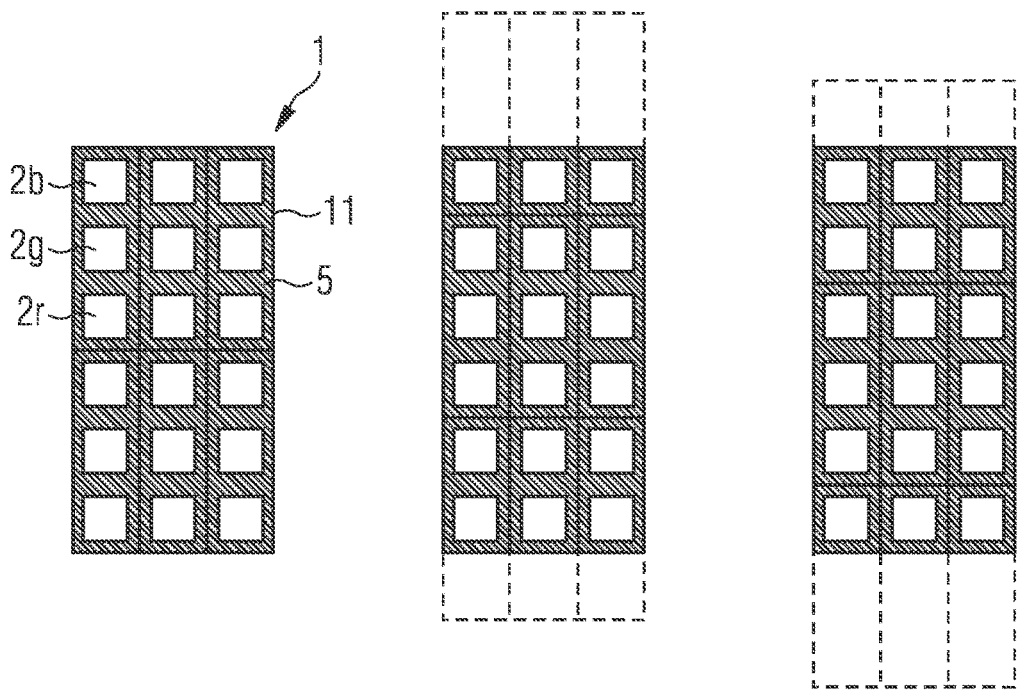
Figure 159:
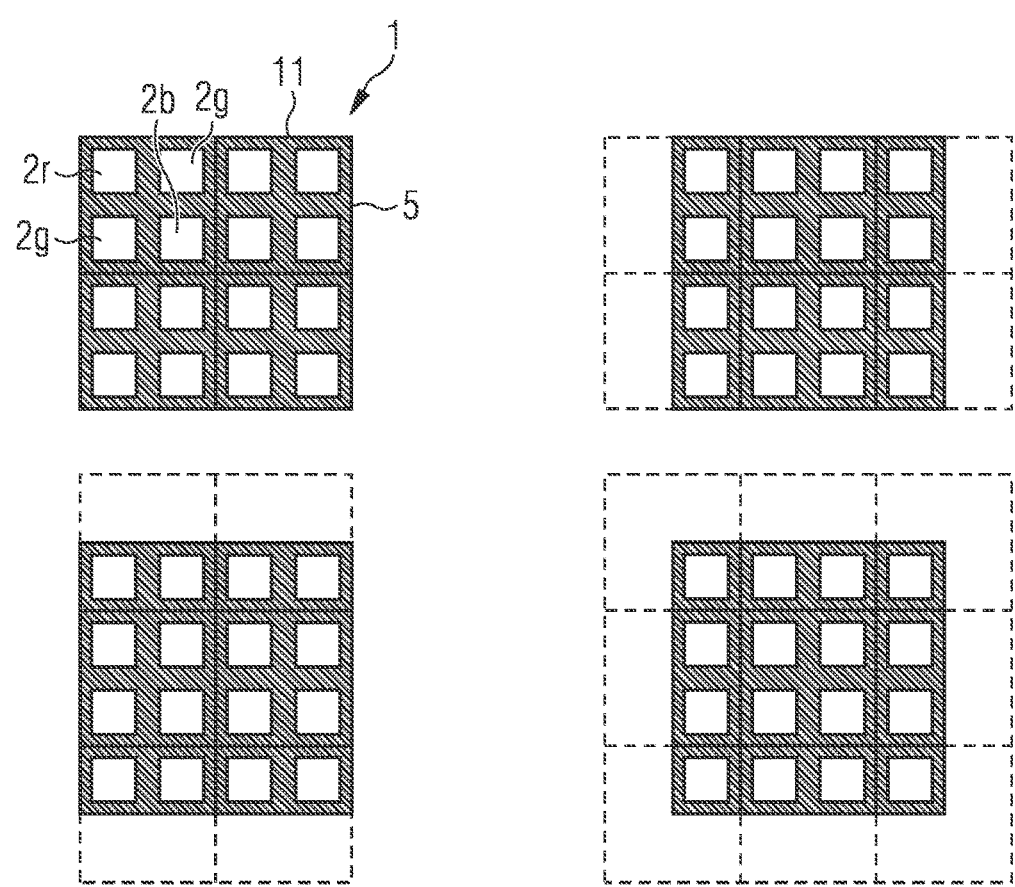

FIGS. 154 to 157 each show a regular arrangement of semiconductor chips 2r, 2g, 2b in the display. FIGS. 156 and 157 relate to a 1×3 arrangement, FIGS. 154 and 155 each to a 2×2 arrangement. Shown in each case is only a small section of the complete display.

FIGS. 154 and 156 show a non-overlapping assignment of pixels and semiconductor chips.

Each pixel is assigned 4 or 3 semiconductor chips and each semiconductor chip is assigned exactly one pixel.

FIGS. 155 and 157, on the other hand, show the appropriate overlapping assignment of pixels and semiconductor chips. Each pixel is assigned 4 or 3 semiconductor chips, but each semiconductor chip is also assigned 4 or 3 pixels. This is additionally illustrated in FIGS. 158 and 159.

In an arrangement according to FIG. 156, n×m pixels can thus be represented classically with and with so-called subsampling and the control according to FIG. 157 n×3×(m−2) pixels. This requires a total of 3×n×m chips in each case.

In a 2×2 arrangement, see FIG. 154, n×m pixels can thus be displayed classically, and with subsampling as shown in FIG. 155, on the other hand, 2×(n−1)×2×(m−1) pixels can be displayed. This requires a total of 2×2×n×m chips.

For large displays, the ratio of required semiconductor chips as a significant cost factor to displayable pixels, i.e. the achievable benefit, is as follows, Arrangement; pixels; cost/benefit ratio:

1×3; adjacent; 3

1×3; overlapping; 1

2×2; side by side; 4

2×2; overlapping; 1

The usual form of downsampling with variable downsampling rate and the special form illustrated here with fixed downsampling rate specified by the display can be combined.

Downsampling can be done on component level, on module level or on display level. The required computing unit can be monolithically integrated on display level or distributed on component level or module level. In particular and advantageously, downsampling can be performed at the display level, but the computing unit is implemented in a distributed manner at the component level and/or module level, so that adjacent modules coordinate accordingly in their pixel overlap area in each case.

Unless otherwise indicated, the components shown in the Figures preferably follow each other directly in the sequence indicated. Layers that do not touch in the Figures are preferably spaced apart. Insofar as lines are drawn parallel to each other, the corresponding surfaces are preferably also aligned parallel to each other. Also, unless otherwise indicated, the relative positions of the drawn components to each other are correctly reproduced in the Figures.

This patent application claims priority to German patent application 10 2018 119 538.9, the disclosure content of which is hereby incorporated by reference.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

LIST OF REFERENCE SIGNS 1 optoelectronic semiconductor device
10 light exit side
2 light emitting semiconductor chip
20 semiconductor layer sequence
22 pixel
23 electrical contact pad
24 electrically conductive layer
25 electrically insulating layer
26 metallization
27 mounting layer
28 wafer
29 growth substrate
3 electrical fanning layer
33 electrical conductor track
35 electrical via
38 planar electrical interconnect
39 contact ball
4 electrical connection pad
5 opaque base body
6 embedding body
61 admixture
62 chip potting
66 partial layer of the embedding body
68 passivation
69 electrical bonding agent
7 additional chip
8 optical coating
9 auxiliary carrier
11 pixel
12 computing unit
13 data stream

The invention claimed is:

1. An optoelectronic semiconductor device which is surface-mountable, comprising:
    at least one semiconductor chip which emits light during operation and comprises electrical contact pads,
    an opaque base body laterally surrounding the at least one semiconductor chip so that side surfaces of the semiconductor chip are directly covered by the base body all around,
    at least one electrical fanning layer with electrical conductor tracks, and
    electrical connection pads for external electrical contacting of the semiconductor device,
    wherein
    the contact pads and the connection pads are located on different sides of the fanning layer,
    the contact pads are electrically connected to the associated connection pads by means of the fanning layer,
    the connection pads are expanded relative to the contact pads,
    the base body extends between the semiconductor chip and the fanning layer and/or the contact pads are embedded in a chip potting of the semiconductor chip and the contact pads terminate flush with the chip potting, and
    the at least one semiconductor chip is a laser diode, a superluminescent diode, or a light emitting diode and configured to emit the light in an infrared range, a visible range, or an ultraviolet range.

2. The optoelectronic semiconductor device according to claim 1,
    wherein
    the connection pads are enlarged relative to the associated contact pads and/or comprise a greater distance from one another,
    the semiconductor chip is a flip chip,
    the conductor tracks of the fanning layer and the connection pads are embedded in at least one embedding body which directly adjoins the base body, and
    a semiconductor layer sequence of the semiconductor chip is located on a side of the contact pads facing away from the fanning layer, and
    a main side of the semiconductor chip facing away from the contact pads is free of the base body.

3. The optoelectronic semiconductor device according to claim 1,
    wherein the semiconductor chip is divided into a plurality of pixels and the pixels are electrically controllable independently of each other.

4. The optoelectronic semiconductor device according to claim 1,
    comprising a plurality of said light emitting semiconductor chips,
    wherein the semiconductor chips are embedded together in the base body, and
    wherein there are altogether fewer connection pads than contact pads.

5. The optoelectronic semiconductor device according to claim 1,
    comprising a plurality of said fanning layers,
    wherein the conductor tracks in the different fanning layers extend at least partially differently from one another, and
    wherein at least one partial layer of an embedding body is present per fanning layer.

6. The optoelectronic semiconductor device according to claim 1,
    wherein adjacent fanning layers are electrically interconnected via electrical vias.

7. The optoelectronic semiconductor device according to claim 1,
    wherein each fanning layer or each of the fanning layers together with the associated vias comprises a thickness of at most 20 m and/or of at most 50% of an average thickness of the at least one semiconductor chip.

8. The optoelectronic semiconductor device according to claim 1,
    comprising at least one additional chip,
    wherein the additional chip is selected from the group consisting of photodiode, phototransistor, IC chip, IC chip with integrated photodiode, temperature-dependent resistor, protection diode against damage by electrostatic discharges, memory chip, address chip, placeholder chip, and
    wherein the additional chip or one of the additional chips is arranged laterally adjacent to the at least one semiconductor chip.

9. The optoelectronic semiconductor device according to claim 1,
    comprising a plurality of said additional chips,
    wherein at least one of the additional chips and the semiconductor chip or at least one of the semiconductor chips are disposed on different sides of the fanning layer.

10. The optoelectronic semiconductor device according to claim 1,
    comprising at least one planar electrical interconnection line located only on a side of the semiconductor chip facing away from the fanning layer or at least one of the semiconductor chips on the base body, wherein at least one interconnection line is electrically connected directly to the fanning layer.

11. The optoelectronic semiconductor device according to claim 1, comprising at least one optical coating at the base body, wherein the coating is selected from the following group: phosphor layer, organic or inorganic protective layer, color filter layer, diffuser layer, coloring layer, anti-reflective layer, dichroic layer, wherein the coating covers the semiconductor chip or at least one of the semiconductor chips.

12. The optoelectronic semiconductor device according to claim 11, wherein, viewed in plan view, a base surface of the semiconductor device is larger than a base surface of the at least one semiconductor chip by at most a factor of three, wherein the coating is a phosphor layer, and wherein the at least one semiconductor chip or the coating terminates flush with the base body in the direction away from the connection pads.

13. The optoelectronic semiconductor device according to claim 1, comprising a plurality of pixels for emitting light of an adjustable color, wherein each pixel comprises a plurality of said semiconductor chips.

14. The optoelectronic semiconductor device according to claim 13, wherein a distance between adjacent semiconductor chips within the pixels is equal to a distance between adjacent pixels.

15. The optoelectronic semiconductor device according to claim 1, wherein an outer edge of the base body as viewed in plan on the light exit side is narrower than a distance between adjacent pixels, such that a plurality of the semiconductor devices are configured to be juxtaposed to arrange the pixels in a uniform pitch across the device.

16. A manufacturing method for optoelectronic semiconductor devices according to claim 1, comprising the following steps in the order indicated:

A) providing the semiconductor chips,
B) embedding the semiconductor chips in the base body,
D) creating the fanning layer,
E) applying the connection pads to the finished fanning layer,
F) creating an opaque embedding body by casting, spraying or pressing, and
G) singulating into the semiconductor devices.

17. The method according to claim 16, wherein at least steps A) to F) are carried out on a temporary auxiliary carrier, wherein the auxiliary carrier is no longer present in the singulated semiconductor devices.

18. The method according to claim 16, wherein between steps B) and D) in a step C) a planarization is performed, during which the base body and the semiconductor chips are reduced in thickness.

19. The method according to claim 16, wherein in step B) at least one main surface of each of the semiconductor chips remains free of the base body and side surfaces of each of the semiconductor chips are covered directly and over their entire area by the base body.

20. An optoelectronic semiconductor device which is surface-mountable, comprising:

at least one semiconductor chip which emits light during operation and comprises electrical contact pads;

an opaque base body laterally surrounding the at least one semiconductor chip so that side surfaces of the semiconductor chip are directly covered by the base body all around;

at least one electrical fanning layer with electrical conductor tracks; and electrical connection pads for external electrical contacting of the semiconductor device;

wherein the contact pads and the connection pads are located on different sides of the fanning layer, the contact pads are electrically connected to the associated connection pads by means of the fanning layer, the connection pads are expanded relative to the contact pads, the base body extends between the semiconductor chip and the fanning layer and/or the contact pads are embedded in a chip potting of the semiconductor chip and the contact pads terminate flush with the chip potting, the base body, the fanning layer and an embedding body terminate flush with each other in a lateral direction, and the at least one semiconductor chip is a laser diode, a superluminescent diode, or a light emitting diode and configured to emit the light in an infrared range, a visible range, or an ultraviolet range.

* * * * *